United States Patent
Tanigawa

(10) Patent No.: US 9,789,566 B2
(45) Date of Patent: Oct. 17, 2017

(54) MANUFACTURING METHOD OF SUBSTRATE, CUTTING METHOD OF PROCESSING OBJECT AND LASER PROCESSING APPARATUS

(71) Applicant: AISIN SEIKI KABUSHIKI KAISHA, Kariya-shi, Aichi-ken (JP)

(72) Inventor: Tatsuya Tanigawa, Anjo (JP)

(73) Assignee: AISIN SEIKI KABUSHIKI KAISHA, Aichi-ken (JP)

( * ) Notice: Subject to any disclaimer, the term of this patent is extended or adjusted under 35 U.S.C. 154(b) by 282 days.

(21) Appl. No.: 14/804,837

(22) Filed: Jul. 21, 2015

(65) Prior Publication Data

US 2016/0052090 A1 Feb. 25, 2016

(30) Foreign Application Priority Data

Aug. 22, 2014 (JP) ................................ 2014-169196

(51) Int. Cl.

| | |
|---|---|
| *B23K 26/364* | (2014.01) |
| *B23K 26/402* | (2014.01) |
| *B23K 26/062* | (2014.01) |
| *H01L 21/78* | (2006.01) |
| *B23K 26/0622* | (2014.01) |
| *B23K 26/53* | (2014.01) |
| *B23K 103/00* | (2006.01) |

(52) U.S. Cl.
CPC ........ *B23K 26/364* (2015.10); *B23K 26/0624* (2015.10); *B23K 26/402* (2013.01); *B23K 26/53* (2015.10); *H01L 21/78* (2013.01); *B23K 2203/56* (2015.10)

(58) Field of Classification Search
CPC  B23K 26/364; B23K 26/0622; B23K 26/402; H01L 21/78
USPC ............ 219/121.69, 121.61, 121.62, 121.72; 438/463, 460, 795; 83/879; 65/112
See application file for complete search history.

(56) References Cited

U.S. PATENT DOCUMENTS

| | | | |
|---|---|---|---|
| 6,399,914 B1* | 6/2002 | Troitski | B23K 26/0604 |
| | | | 219/121.69 |
| 6,864,947 B2* | 3/2005 | Shiraishi | C03B 33/076 |
| | | | 349/158 |

(Continued)

FOREIGN PATENT DOCUMENTS

| | | | |
|---|---|---|---|
| JP | 4940359 B1 | 5/2012 | |
| JP | 4971266 B2 | 7/2012 | |

(Continued)

*Primary Examiner* — Samuel M Heinrich

(74) *Attorney, Agent, or Firm* — Sughrue Mion, PLLC

(57) ABSTRACT

A manufacturing method of a substrate, the method includes a crack forming process of forming a crack along an interface between a first portion of a processing object and a second portion of the processing object, the crack-forming process forming the crack in a manner that an ultrashort-pulse laser light is irradiated so that a focus point thereof is positioned at the interface or in a vicinity thereof, and a separating process of separating the processing object at the crack, wherein an impurity concentration of the first portion and an impurity concentration of the second portion are different from each other or material of the first portion and material of the second portion are different from each other.

9 Claims, 17 Drawing Sheets

(56) References Cited

U.S. PATENT DOCUMENTS

| | | | |
|---|---|---|---|
| 8,268,701 B2* | 9/2012 | Yamazaki | H01L 21/67144 |
| | | | 257/E21.008 |
| 8,324,078 B2 | 12/2012 | Legros | |
| 8,852,698 B2* | 10/2014 | Fukumitsu | B23K 26/03 |
| | | | 219/121.72 |
| 2013/0285074 A1 | 10/2013 | Kakowaki et al. | |

FOREIGN PATENT DOCUMENTS

| | | |
|---|---|---|
| JP | 2013-049161 A | 3/2013 |
| JP | 5441057 B2 | 3/2014 |

\* cited by examiner

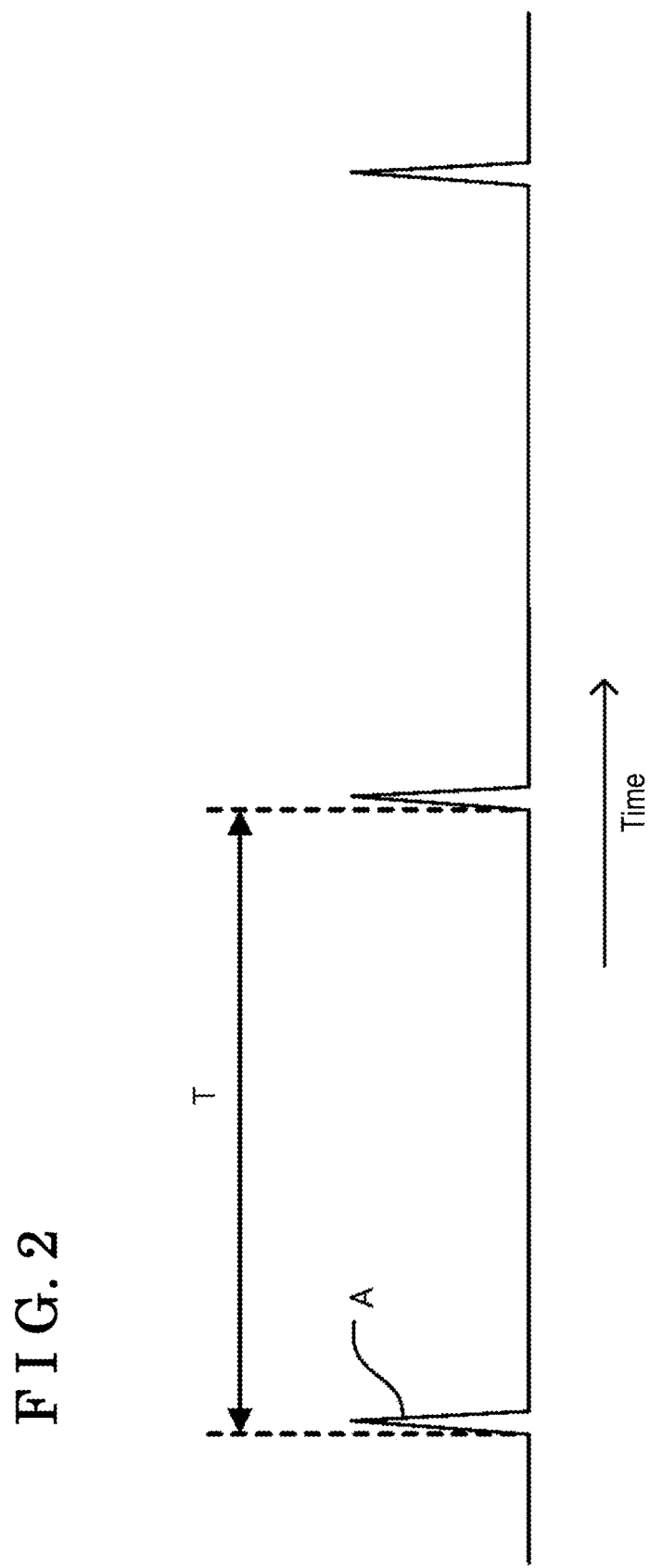

Scanning with laser light

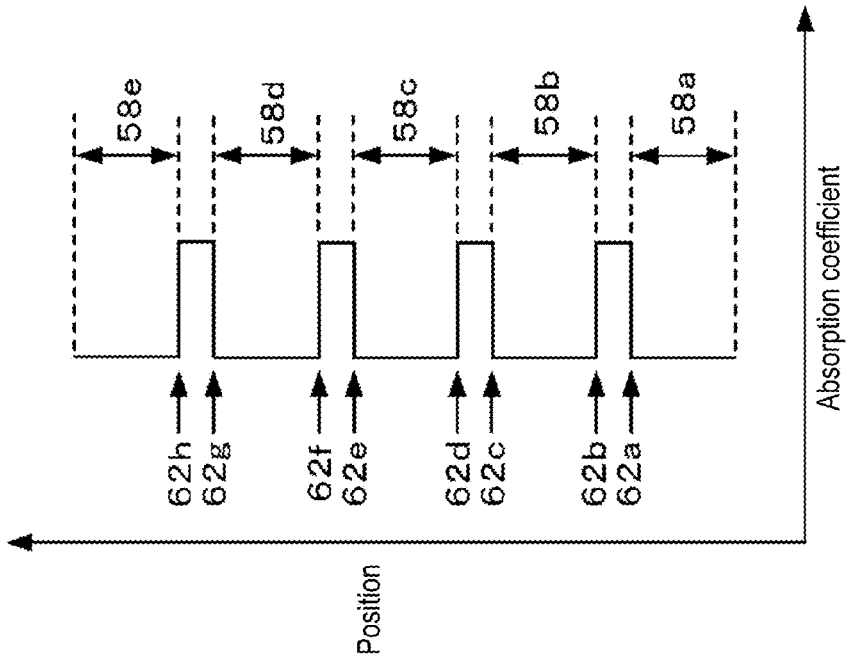
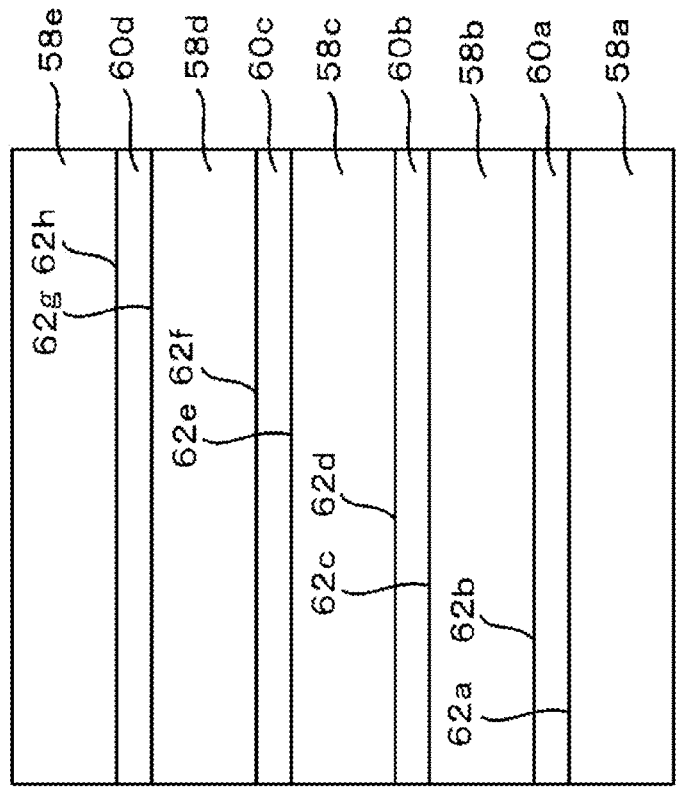
FIG. 13A
FIG. 13B

FIG. 16A
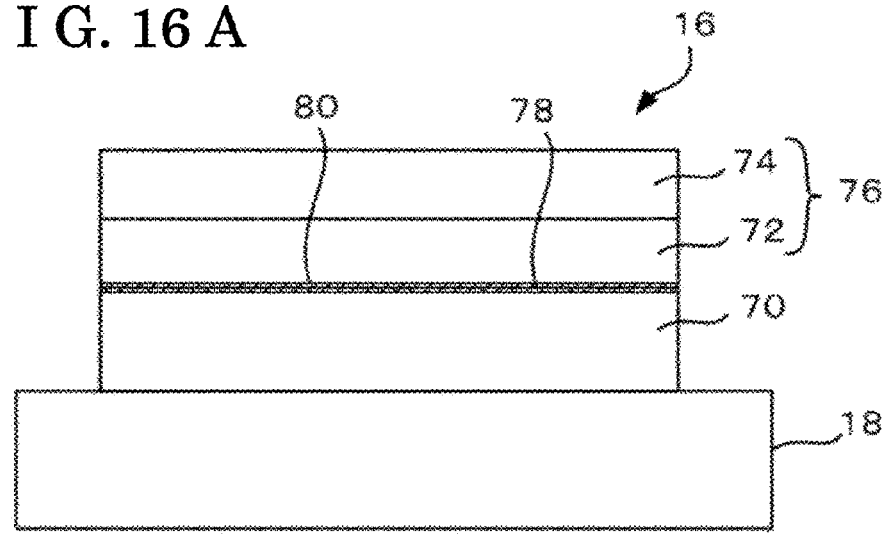
FIG. 16B
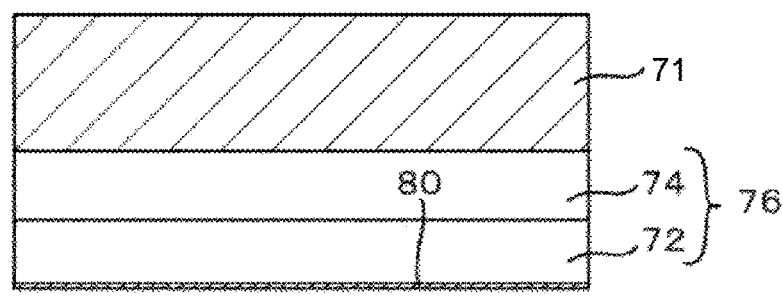
FIG. 16C
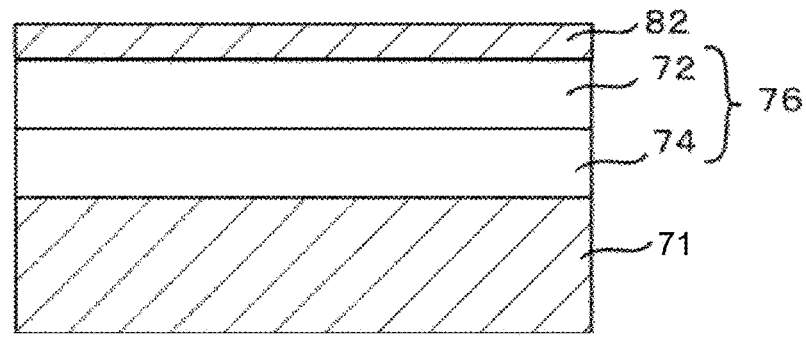

MANUFACTURING METHOD OF SUBSTRATE, CUTTING METHOD OF PROCESSING OBJECT AND LASER PROCESSING APPARATUS

CROSS REFERENCE TO RELATED APPLICATIONS

This application is based on and claims priority under 35 U.S.C. §119 to Japanese Patent Application 2014-169196, filed on Aug. 22, 2014, the entire content of which is incorporated herein by reference.

TECHNICAL FIELD

This disclosure generally relates to a manufacturing method of a substrate, a cutting method of a processing object and a laser processing apparatus.

BACKGROUND DISCUSSION

Conventionally, a semiconductor substrate is widely used as a base material of a semiconductor device, for example. The semiconductor substrate is manufactured by thinly cutting ingot of semiconductor. In a known method of manufacturing the semiconductor substrate, first, the ingot is manufactured by using a desired semiconductor material, for example. Next, the ingot is cut by using a cutting apparatus to obtain the semiconductor substrate. Next, both surfaces of the semiconductor substrate obtained in the above-described way are flattened by, for example, grinding or polishing. Thus, the semiconductor substrate including a desired thickness is obtained.

As such a cutting apparatus, a cutting apparatus using a wire saw is suggested (JP5441057B, which will be hereinafter referred to as Patent reference 1), for example.

A technique of cutting a processing object along a planned cut surface is also suggested (JP2013-49161A, which will be hereinafter referred to as Patent reference 2), where pulse laser light is irradiated along the planned cut surface of the processing object and thus a modified region is generated along the planned cut surface.

A technique of forming a semiconductor layer on the substrate via a lift-off layer, and thereafter dissolving and removing the lift-off layer is suggested (JP4940359B, which will be hereinafter referred to as Patent reference 3), although the technique is unrelated to the cutting of the ingot.

In addition, a technique of forming a brittle surface by performing ion implantation to the substrate, and separating and removing a thin layer on the brittle surface from the substrate is also suggested (JP4971266B, which will be hereinafter referred to as Patent reference 4).

However, according to the technique described in Patent reference 1, it takes a long time period for the cutting. According to the technique described in Patent reference 4, the separation and removal cannot be performed at a deep portion of the substrate to which the ion cannot be implemented. According to the technique described in Patent reference 2, the modified region varies in a depth direction, and therefore it is difficult to cut the processing object with a high precision along the planned cut surface.

A need thus exists for a manufacturing method of a substrate, a cutting method of a processing object and a laser processing apparatus, which are not susceptible to the drawback mentioned above.

SUMMARY

According to an aspect of this disclosure, a manufacturing method of a substrate includes a crack forming process of forming a crack along an interface between a first portion of a processing object and a second portion of the processing object, the crack-forming process forming the crack in a manner that an ultrashort-pulse laser light is irradiated so that a focus point of the ultrashort-pulse laser light is positioned at the interface or in a vicinity of the interface, and a separating process of separating the processing object at the crack, wherein an impurity concentration of the first portion and an impurity concentration of the second portion are different from each other or material of the first portion and material of the second portion are different from each other.

According to another aspect of this disclosure, a cutting method of a processing object includes a crack forming process of forming a crack along an interface between a first portion of the processing object and a second portion of the processing object, the crack-forming process forming the crack in a manner that an ultrashort-pulse laser light is irradiated so that a focus point of the ultrashort-pulse laser light is positioned at the interface or in a vicinity of the interface, and an a separating process of separating the processing object at the crack, wherein an impurity concentration of the first portion and an impurity concentration of the second portion are different from each other or material of the first portion and material of the second portion are different from each other.

According to a further aspect of this disclosure, a laser processing apparatus includes a light source emitting an ultrashort-pulse laser light, and a control portion forming a crack along an interface between a first portion of a processing object and a second portion of the processing object, the control portion forming the crack in a manner that an ultrashort-pulse laser light is irradiated so that a focus point of the ultrashort-pulse laser light is positioned at the interface or in a vicinity of the interface, wherein an impurity concentration of the first portion and an impurity concentration of the second portion are different from each other or material of the first portion and material of the second portion are different from each other.

BRIEF DESCRIPTION OF THE DRAWINGS

The foregoing and additional features and characteristics of this disclosure will become more apparent from the following detailed description considered with the reference to the accompanying drawings, wherein:

FIG. 2 is a time chart schematically illustrating a waveform of a laser light emitted from a laser light source according to the embodiments disclosed here;

FIG. 13A is a view illustrating a processing object according to a first variation of the second embodiment;

FIG. 13B is a view illustrating the processing object according to the first variation of the second embodiment;

FIG. 16A is a view illustrating a process of the cutting method of the processing object and the manufacturing method of the semiconductor device, according to the third embodiment;

FIG. 16B is a view illustrating a process of the cutting method of the processing object and the manufacturing method of the semiconductor device, according to the third embodiment;

FIG. 16C is a view illustrating a process of the cutting method of the processing object and the manufacturing method of the semiconductor device, according to the third embodiment.

DETAILED DESCRIPTION

Figure 1:
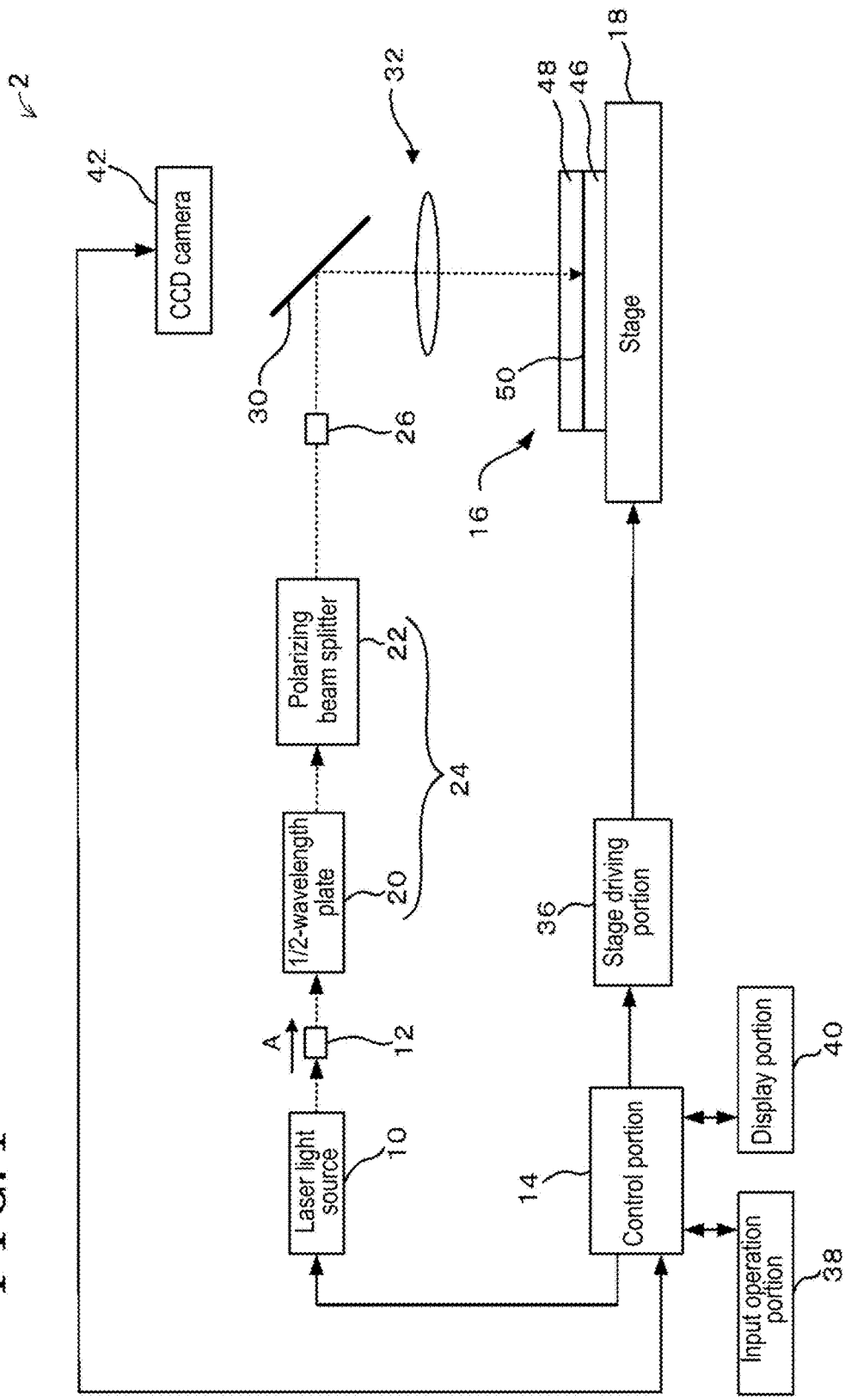
FIG. 1 is a schematic view illustrating an example of a laser processing apparatus according to embodiments disclosed here.

Embodiments disclosed here will be described with reference to drawings. This disclosure is not limited to the following embodiments and may be appropriately changed or modified without departing from a subject matter of the disclosure. In the drawings described below, the same reference numerals designate the same or corresponding functions and description thereof may be omitted or simplified.

A cutting method of a processing object, a manufacturing method of a substrate, and a laser processing apparatus according to a first embodiment disclosed here will be described with reference to the drawings.

First, the laser processing apparatus according to the present embodiment will be described. FIG. 1 is a schematic view illustrating an example of the laser processing apparatus. In FIG. 1, connections among components of the laser processing apparatus are drawn with solid lines and an optical path of a laser light A is drawn with dotted lines.

A laser processing apparatus 2 according to the present embodiment irradiates a predetermined interface 50 or the vicinity of the interface 50 with a laser beam, and thereby growing a crack 53 (refer to FIG. 4B) in a manner that the crack 53 grows along the interface 50. The interface 50 is formed at a processing object 16 in advance. At the interface 50, or at the vicinity or neighborhood of the interface 50, the crack 53 is formed along the interface 50. The processing object 16, that is, the object to be processed, which is formed with the crack 53 can be separated at the crack 53. The interface 50 pre-formed, that is, formed in advance, at the processing object 16 is the interface 50 between a first portion 46 and a second portion 48. For example, an impurity concentration of the first portion 46 and an impurity concentration of the second portion 48 differ from each other. The interface 50 pre-formed at the processing object 16 is not limited to the interface between the first portion 46 and the second portion 48 of which the impurity concentrations differ from each other, and can be an interface 78 between a first portion 70 and a second portion 72 of which materials differ from each other, for example (refer to FIG. 16A). In the present description, the materials being different from each other include compositions being different from each other.

The laser processing apparatus 2 according to the present embodiment includes a laser light source 10 (i.e., a light source) emitting the laser light A, a control portion 14 controlling the entire laser processing apparatus of the present embodiment. In addition, the laser processing apparatus 2 of the present embodiment includes a stage 18 on which the processing object (a workpiece, an object of treatment, an object, a member, an article, ingot) 16 serving as an object of cutting is placed.

The laser processing apparatus 2 according to the present embodiment is provided at a manufacturing apparatus manufacturing a product including a substrate, for example. Here, explanation is made on a case where the substrate is manufactured, however, the application of the laser processing apparatus 2 is not limited to the manufacturing of the substrate. The laser processing apparatus 2 according to the present embodiment can cut the processing object 16 of various types, thereby manufacturing various articles.

The control portion 14 includes a central processing unit (CPU) executing the processing including various calculations, controls, discriminations. In addition, the control portion 14 includes, for example, read-only memory (ROM) which stores, for example, various control programs which are executed by the CPU. In addition, the control portion 14 includes, for example, random access memory (RAM) which temporarily stores, for example, data being processed by the CPU and/or input data.

An input operation portion 38 is connected to the control portion 14. The input operation portion 38 is for a user to input a predetermined command and/or data, for example. For example, a keyboard and/or various switches are used as the input operation portion 38.

A display portion 40 for performing various display is connected to the control portion 14. On the display portion 40, for example, an operation status of the laser processing apparatus 2, a status of the stage 18, images obtained by a CCD camera 42 are displayed. For example, a liquid crystal display is used as the display portion 40.

The laser light source 10 is configured to emit the laser light (laser beam) A. Here, for example, an ultrashort-pulse laser light is used as the laser light A. For example, a femtosecond laser light is used as the ultrashort-pulse laser light. Generally, the femtosecond laser light corresponds to pulse laser light of which a pulse width is femtosecond (fs: $10^{-15}$ second) order, that is, the pulse laser light of which the pulse width is equal to or greater than 1 fs and is less than 1 ps. For example, a pulse laser beam of which the pulse width is femtosecond order is emitted from the laser light source 10. As the laser light source 10 of the present embodiment, for example, a laser oscillator of which a center wavelength is approximately 1.05 μm and of which a pulse width is approximately 500 fs is used. The ultrashort-pulse laser light is used in the present embodiment because the ultrashort-pulse laser light can achieve precision microfabrication without causing thermal melting.

Here, the explanation is made on a case where the pulse width of the laser light A is approximately 500 fs, however, the pulse width of the laser light A is not limited to approximately 500 fs. In addition, the pulse width of the laser light A is not limited to femtosecond order and may be picosecond order. In the present disclosure, the ultrashort-pulse laser light is not limited to the laser light of which the pulse width is femtosecond, and the ultrashort-pulse laser light includes a picosecond laser light of which the pulse width is equal to or less than several tens of picoseconds. In addition, in the present disclosure, the femtosecond laser light is not limited to the laser light of which the pulse width is femtosecond, and the femtosecond laser light includes the picosecond laser light of which the pulse width is equal to or less than several tens of picoseconds.

In addition, a center wavelength of the laser light A emitted from the laser light source is not limited to approximately 1.05 μm and may be set appropriately.

An output power of the laser light source 10 emitting the laser light A is, for example, approximately 1 W. The output power of the laser light source 10 emitting the laser light A is not limited to approximately 1 W and may be set appropriately.

The laser light source 10 is controlled by the control portion 14. The pulse width of the laser light A emitted from the laser light source 10 may be set appropriately by the user via the input operation portion 38. For example, various setting information inputted by the user is appropriately stored within a memory portion provided at the control portion 14. The control portion 14 controls the laser light source 10 so that the laser light A is delivered to the interface 50 formed at the processing object 16 or to the vicinity of the interface 50. The irradiation of the laser light A emitted from the laser light source 10 can be appropriately set by the user via the input operation portion 38. The control portion 14 causes the laser light source 10 to emit the pulse of the laser light A at a repetition frequency or a repetition cycle that is set in advance.

FIG. 2 is a time chart schematically showing a waveform of the laser light A emitted from the laser light source. As illustrated in FIG. 2, the pulse of the laser light A is emitted at a predetermined repetition cycle T. The pulse repetition frequency of the laser light A is, for example, approximately 100 kHz to 1 MHz. The pulse repetition frequency of the laser light A can be appropriately set by the user via the input operation portion 38. The pulse repetition frequency of the laser light A is not limited to approximately 100 kHz to 1 MHz and can be appropriately set.

A beam expander 12 for adjusting a beam radius of the laser light A is provided downstream of, that is, at a rear phase relative to, the laser light source 10 emitting the laser light A. A ½-wavelength plate 20 controlling a polarization direction of the laser light A is provided downstream of the beam expander 12. A polarizing beam splitter 22 adjusting output of the laser light A is provided downstream of the ½-wavelength plate 20. The ½-wavelength plate 20 is an optical device which changes the polarization direction of the laser light A as the ½-wavelength plate 20 is rotated. The polarizing beam splitter 22 is an optical device which splits polarized component of an incident light. As the ½-wavelength plate 20 is rotated and accordingly the polarization direction of the laser light A is changed, a ratio of polarization component that is split at the polarizing beam splitter 22 changes. By appropriately adjusting a rotational angle of the ½-wavelength plate 20, the power of the laser light A emitted from the polarizing beam splitter 22 is appropriately adjusted. The ½-wavelength plate 20 and the polarizing beam splitter 22 constitute an output attenuator 24. Thus, laser intensity of the laser light A emitted from the laser light source 10 is configured to be adjusted by the output attenuator 24. The laser intensity of the laser light A can be appropriately set by the user via the input operation portion 38.

It is ideal that pulse energy (the laser intensity) of the laser light A adjusted by the output attenuator 24, that is, the pulse energy of the laser light A delivered to the processing object 16, is set to be higher than a pulse energy which is necessary to causes the crack 53 at the processing object 16. This is because, in a case where the pulse energy of the laser light A delivered to the processing object 16 is excessively small, the crack 53 may not be grown appropriately or sufficiently at the processing object 16. However, the sufficient crack 53 does not need to be generated at the processing object 16 at a phase at which the laser light A is delivered once. The crack 53 may be generated at the processing object 16 at a phase at which the laser light A is delivered for plural times. That is, the crack 53 may be grown through the repeated irradiations of the laser light A. Here, the pulse energy of the laser light A delivered to the processing object 16 is approximately 1 μJ/pulse to 100 μJ/pulse, for example. The pulse energy of the laser light A irradiated to the processing object 16 is not limited to approximately 1 μJ/pulse to 100 μJ/pulse and can be set appropriately.

Here, the explanation is made on a case where the intensity of the laser light A is adjusted with the use of the output attenuator 24 constituted by the ½-wavelength plate 20 and the polarizing beam splitter 22, however, a unit or mechanism which adjusts the intensity of the laser light A is not limited thereto. The intensity of the laser light A can be appropriately adjusted by using an arbitrary adjustment unit or mechanism.

A beam expander 26 for adjusting the beam radius of the laser light A is provided downstream of, that is, at a rear phase relative to, the output attenuator 24. A mirror 30 is provided downstream of the beam expander 26. The laser light A that has entered the mirror 30, that is, the laser light A that is incident on the mirror 30, is reflected at the mirror 30 and then is introduced to a lens (an object lens) 32. A numerical aperture (NA) of the lens is ideally 0.5 or greater, for example. The beam radius of the laser light A at a focus point (a focal point, a beam waist) 55 of the laser light A (refer to FIG. 6) is approximately 2 μm, for example. The beam radius at the focus point 55 of the laser light A is not limited to approximately 2 μm and can be appropriately set.

The stage 18 is positioned below the lens 32. The processing object 16, which is the object of the cutting, is mounted on the stage 18. A stage driving portion 36 for driving or actuating the stage 18 is connected to the stage 18. The control portion 14 drives the stage 18 via the stage driving portion 36. For example, an XYZθ-axis stage may be used as the stage 18. The stage 18 is not limited to the XYZθ-axis stage and/or a rotation stage, and an XY-axis stage or an XYZ-axis stage may be used, for example. Ambient atmosphere of the processing object 16 that is arranged on the stage 18 is, for example, the atmosphere (air).

The CCD camera 42 is provided above the stage 18. The image obtained by the CCD camera 42 is inputted to the control portion 14. The control portion 14 uses the image obtained by the CCD camera 42 and performs, for example, a positioning of the processing object 16.

Before the scanning of the laser light A relative to the processing object 16 is started, a position of the processing object 16 is set at a predetermined position. The control portion 14 appropriately controls the stage 18 via the stage driving portion 36, and thereby positioning the processing object 16 within a range in which the scanning of the laser light A can be conducted.

A direction of irradiation of the laser light A, that is, a light axis (a traveling direction) of the laser light A entering the processing object 16, corresponds to a direction intersecting an in-plane direction of the interface 50 pre-formed at the processing object 16, more specifically, the light axis of the laser light A entering the processing object 16 corresponds to a normal direction of the interface 50. On the other hand, a scanning direction of the laser light A, that is, a direction in which the focus point 55 of the laser light A moves, corresponds to the in-plane direction of the interface 50 pre-formed at the processing object 16.

By moving the stage 18 via the stage driving portion 36, the scanning of the laser light A relative to the processing object 16 is performed. The control relative to the stage driving portion 36 is conducted by, for example, the control portion 14. A scanning speed of the laser light A can be appropriately set by the user via the input operation portion 38. The scanning speed of the laser light A is, for example, approximately 1 m/s in a case where the pulse repetition frequency of the laser light A is, for example, approximately 1 MHz. The scanning speed of the laser light A is not limited to approximately 1 m/s and can be appropriately set.

A cross-sectional shape 66a (i.e., a cross section) of the ultrashort-pulse laser light A at the focus point 55 is, for example, a circular shape. However, the cross-sectional shape of the laser beam at the focus point 55 is not limited to the circular shape. For example, the cross-sectional shape of the laser beam at the focus point 55 may include an oval or elliptical shape.

The focus point 55 of the laser light A is, for example, the interface 50 pre-formed at the processing object 16. By moving the stage 18 up and down in a normal direction of an upper surface of the stage 18, the focus point 55 of the laser light A can be set at a desired portion.

The focus point 55 of the laser light A does not need to match the interface 50 that is pre-formed at the processing object 16. For example, the focus point 55 of the laser light A can be positioned slightly above or slightly below relative to the interface 50 pre-formed at the processing object 16. Even in a case where the focus point 55 of the laser light A is slightly displaced from the interface 50 pre-formed at the processing object 16, the crack can grow along the interface 50.

Figure 6A:
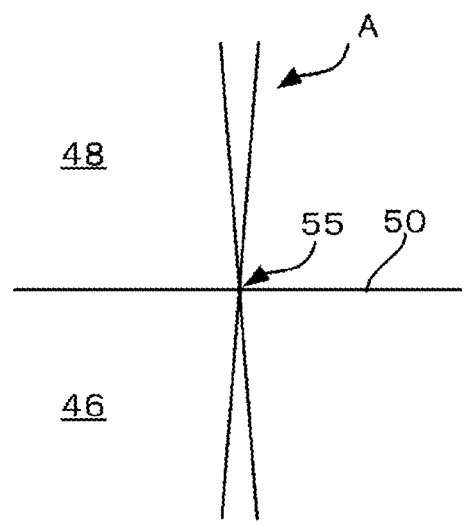
FIG. 6A is a side view illustrating a focus point of the laser light according to the embodiments.
Figure 6B:
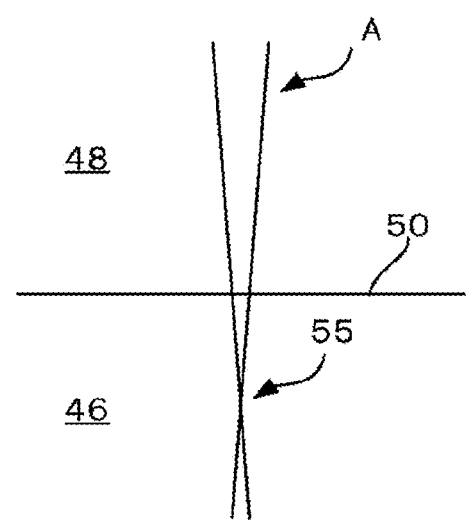
FIG. 6B is a side view illustrating the focus point of the laser light.
Figure 6C:
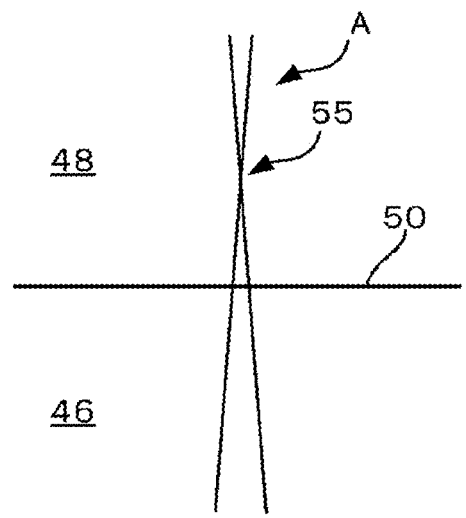
FIG. 6C is a side view illustrating the focus point of the laser light.

In addition, the focus point 55 of the laser light A which is deliberately or intentionally set slightly above or below relative to the interface 50 pre-formed at the processing object 16 may cause the crack 53 to grow more easily. FIG. 6A is a cross-sectional view illustrating a state where the focus point 55 of the laser light A is positioned at the interface 50. FIG. 6B is a cross-sectional view illustrating a state where the focus point 55 of the laser light A is positioned below relative to the interface 50. FIG. 6C is a cross-sectional view illustrating a state where the focus point 55 of the laser light A is positioned above relative to the interface 50. In a case where the focus point 55 of the laser light A is displaced or shifted in a depth direction, that is, in a case where the focus point 55 of the laser light A is displaced or shifted in the normal direction of the interface 50 from the interface 50, a cross-sectional area of the laser light A at the interface 50 is larger than a cross-sectional area of the laser light A at the focus point 55. The increased cross-sectional area of the laser light A at the interface 50 contributes to reduction of a distance between the crack 53 formed by the scanning that is already performed (that is, the already-formed crack 53) and the laser light A that is to be scanned after the formation of the already-formed crack 53. In a case where the distance between the already-formed crack 53 and the laser light A that is to be scanned after the formation of the already-formed crack 53 becomes small, the crack 53 that is to be formed by the scanning of the laser light A that is to be scanned after the formation of the already-formed crack 53 and the already-formed crack 53 are easily connected with each other. Consequently, intentionally positioning the focus point 55 of the laser light A slightly above or slightly below relative to the interface 50 contributes to the effective formation of the crack 53 in such a manner that the crack 53 is generated along the interface 50. For the above-described reason, the focus point 55 of the laser light A which is intentionally set slightly above or below relative to the interface 50 pre-formed at the processing object 16 may facilitate the generation of the crack 53 more easily.

In a case where the focus point 55 of the laser light A is displaced in the depth direction excessively, however, a reaction which generates the crack 53 does not occur in the vicinity of the interface 50, and therefore it is difficult for the crack 53 to be formed. Thus, it is ideal that the excessive displacement of the focus point 55 of the laser light A in the depth direction (a direction of the light axis of the laser light A) is avoided. Accordingly, in a case where the focus point 55 of the laser light A is set in the vicinity of the interface 50 but not at the interface 50, it is ideal that the focus point 55 of the laser light A is set within a range where the crack 53 can be generated. Therefore, in the present description, when the focus point 55 is positioned in the vicinity of the interface, "the vicinity of the interface" corresponds to being within the range where the crack can be generated along the interface. The distance between the focus point 55 of the laser light A and the interface 50 in the depth direction is ideally, for example, 30 µm or smaller.

Figure 7A:
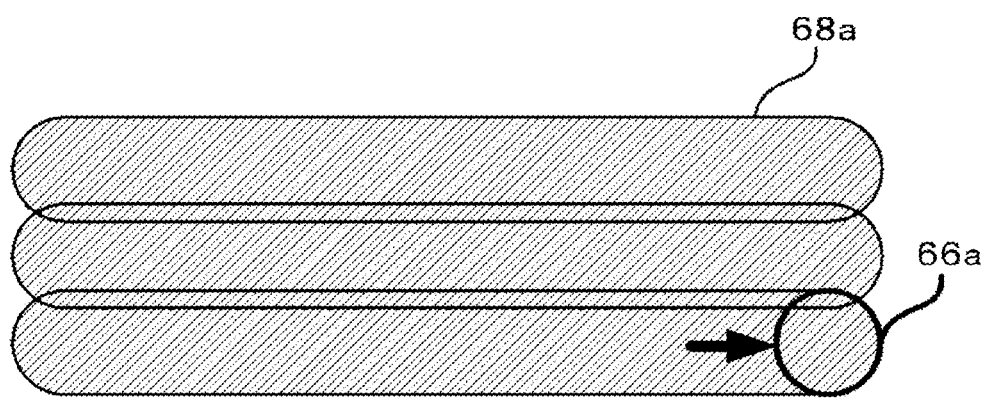
FIG. 7A is a view illustrating an example of a cross-sectional shape of the laser light at the focus point thereof according to the embodiments.
Figure 7B:
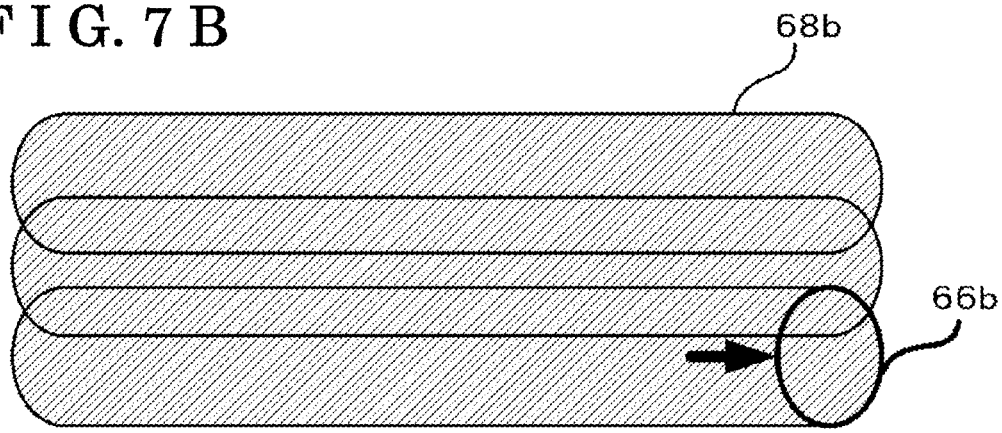
FIG. 7B is a view illustrating an example of the cross-sectional shape of the laser light at the focus point thereof.

It is ideal that the cross-sectional shape of the laser light A at the interface 50 is set to include the oval shape. At this time, a long axis direction of the oval shape is set to intersect the scanning direction of the laser light A. More ideally, the long axis direction of the oval shape may be set to be orthogonal to the scanning direction of the laser light A. FIG. 7A is a plan view illustrating an example of a scanning path or scanning locus of the laser light A in a case where the cross-sectional shape 66a of the laser light A at the interface 50 is set to be circular. FIG. 7B is a plan view illustrating an example of the scanning locus of the laser light A in a case where a cross-sectional shape 66b (i.e., the cross section) of the laser light A at the interface 50 is set to be oval. In FIGS. 7A and 7B, explanation is made on a case where the scanning loci or scanning paths of the laser light A are overlapped with each other, however, the same is applied to a case where the scanning loci of the laser light A are not overlapped with each other. That is, in a case where the cross-sectional shape of the laser light A is set to be oval, the distance between the crack 53 formed by the scanning that is already performed (that is, the already-formed crack 53) and the laser light A that is to be scanned after the formation of the already-formed crack 53 is reduced. In a case where the distance between the already-formed crack 53 and the laser light A that is to be scanned after the formation of the already-formed crack 53 is small, the crack 53 that is to be formed by the scanning of the laser light A that is to be scanned after the formation of the already-formed crack 53 and the already-formed crack 53 are easily connected with each other. Consequently, setting the cross-sectional shape of the laser light A to be oval contributes to the effective formation of the crack 53 in such a manner that the crack 53 is generated along the interface 50. For the above-described reason, the cross-sectional shape of the laser light A at the interface 50 is ideally set to be oval.

A portion of the processing object 16 which is to be scanned with the laser light A, that is, a planned laser irradiation portion, may be programmed into the control portion 14 in advance, or it may be configured in such a manner that the user sets the planned laser irradiation portion via the input operation portion 38 when starting the scan with the laser light A. When starting scanning the processing object 16 with the laser light A, the user provides an instruction to start the scan with the laser light A via the input operation portion 38, for example. In a case where the instruction to start the scan with the laser light A is inputted, the control portion 14 conducts the scan with the laser light A by moving the stage 18 while controlling the laser light source 10 to emit the laser light A repeatedly. The scan of the laser light A is conducted in a manner that the laser light A draws, for example, a linear scanning locus on the stage 18. By performing the scanning with the laser light A, which creates the linear scanning locus, for plural times in such a manner that the linear scanning loci or linear scanning paths of the laser light A are parallel to each other, the laser light A is delivered to an entire planned laser irradiation range. After completion of the irradiation with the laser light A, a plane (the scanning locus, a locus surface) defined by the focus points 55 connected to each other is along the interface 50 that is formed at the processing object 16 in advance.

Once the irradiation of the laser light A in the entire planned laser irradiation range is completed, the control portion 14 finishes the emission of the laser light A from the laser light source 10 and finishes the scanning with the laser light A which is conducted by moving the stage 18. The scan with the laser light A may be completed by the user providing an instruction to finish the scanning with the laser light A via the input operation portion 38.

As described above, the laser processing apparatus according to the present embodiment delivers the ultrashort-pulse laser light A to the interface 50 that is formed at the processing object 16 in advance or to the vicinity of the interface 50.

Next, the cutting method of the processing object and the manufacturing method of the substrate where the cutting method is used, which are according to the present embodiment, will be described. Each of FIGS. 3A to 5C is a view illustrating a process of the cutting method of the processing object and the manufacturing method of the substrate according to the present embodiment.

When performing the cutting method of the processing object and the manufacturing method of the substrate according to the present embodiment, for example, the laser processing apparatus 2 described above can be used, but not limited thereto. A laser processing apparatus which can irradiate the ultrashort-pulse laser light A to the interface 50 formed in advance at the processing object 16 or to the vicinity of the interface 50 may be appropriately used in the cutting method of the processing object and the manufacturing method of the substrate according to the present embodiment.

Figure 3A:
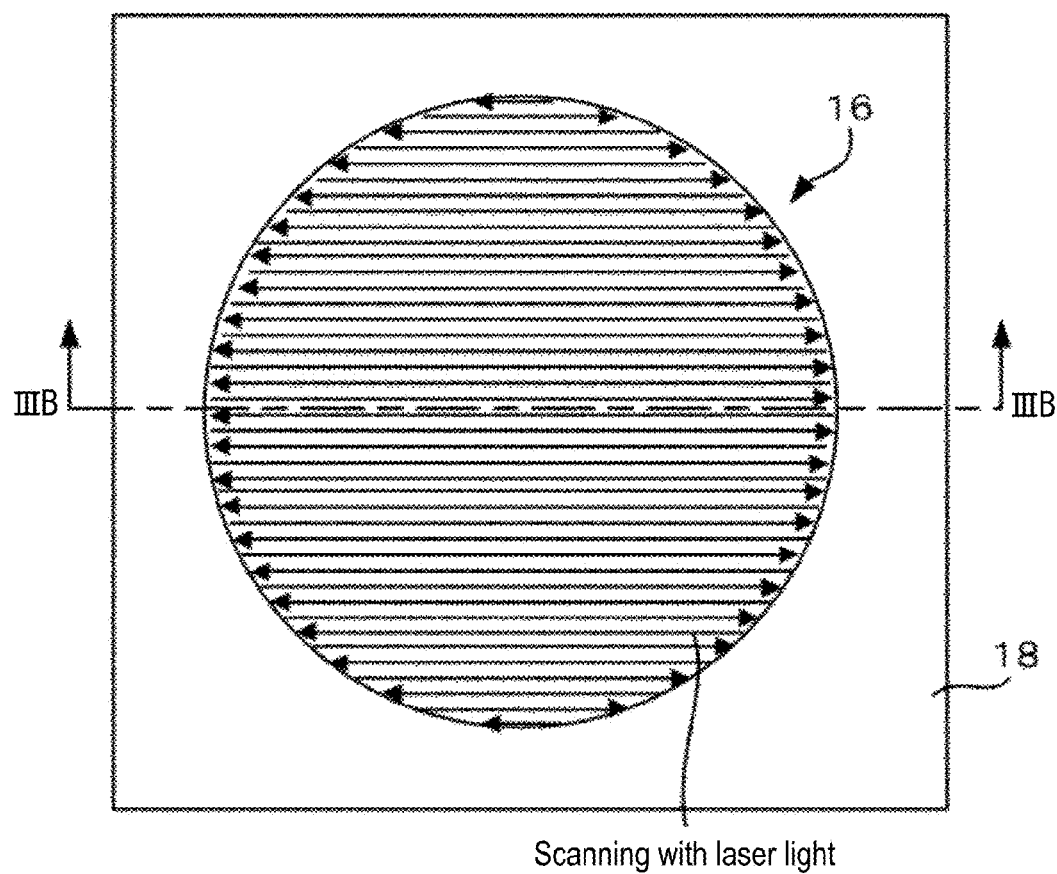
FIG. 3A is a view illustrating a process of a cutting method of a processing object and a manufacturing method of a substrate, according to a first embodiment disclosed here.
Figure 3B:
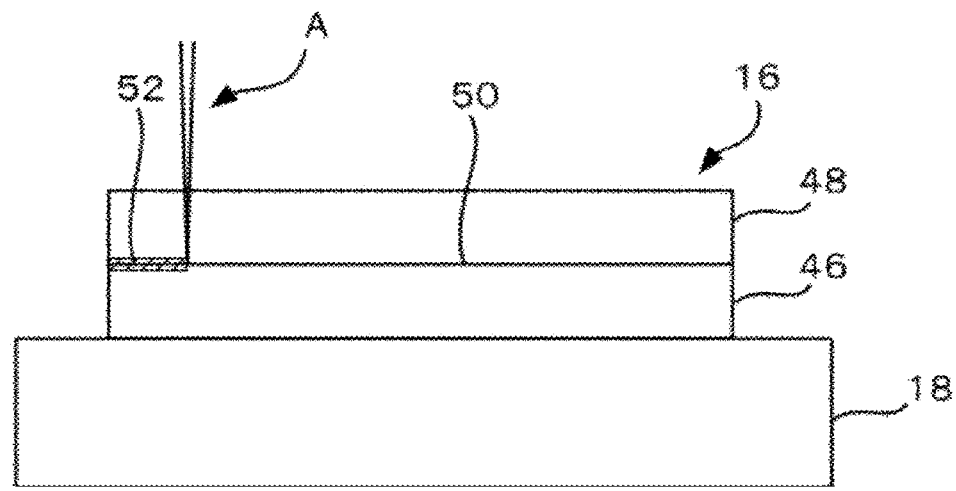
FIG. 3B is a cross-sectional view taken along line IIIB-IIIB in FIG. 3A.

First, as illustrated in FIGS. 3A and 3B, the processing object 16 is placed on the stage 18. FIG. 3A is a plan view and FIG. 3B is a cross-sectional view taken along line IIIB-IIIB in FIG. 3A. Material of the processing object 16 serving as the object of cutting is not limited to any particular material. However, in order to grow the crack 53 by irradiating the processing object 16 with the ultrashort-pulse laser light A from above the processing object 16 in a manner that the crack 53 is grown along the interface 50 pre-formed at the processing object 16, the ultrashort-pulse laser light A needs to pass through the processing object 16 and to reach the interface 50 or the vicinity of the interface 50. Therefore, transparent material relative to the ultrashort-pulse laser light A is used as the material of the processing object 16. The material of the processing object 16 includes semiconductor material, for example. The semiconductor material includes silicon carbide (SiC), silicon (Si), gallium nitride (GaN), aluminum nitride (AlN), indium nitride (InN), gallium arsenide (GaAs), indium phosphide (InP), gallium phosphide (GaP), for example. Here, for example, SiC is used as the material of the processing object 16.

The material of the processing object 16 is not limited to the semiconductor material. A material which is transparent relative to the ultrashort-pulse laser light A may be widely used as the material of the processing object 16. The material which is transparent relative to the ultrashort-pulse laser light A includes glass, sapphire, diamond, ceramics, semiconductor material, for example. Thus, glass can be used as the material of the processing object 16. Such a glass includes alkali-free glass, blue-plate glass, white-plate glass, borosilicate glass, fused silica, for example.

The interface 50 formed in advance at the processing object 16 is an interface or a boundary surface between the first portion 46 and the second portion 48 of which the impurity concentrations differ from each other, for example. The impurity concentration of the first portion 46 is set to be a relatively high concentration. More specifically, the impurity concentration at the first portion 46 is set to be approximately $1 \times 10^{17}$ to $1 \times 10^{18}$ $cm^{-3}$, for example. A conductivity type of the first portion 46 is $n^+$ type, for example. On the other hand, a conductivity type of the second portion 48 is i type, for example. Semiconductor material of the i type, that is, intrinsic semiconductor, is semiconductor to which impure substance is not added. The impurity concentration at the second portion 48 is approximately $1 \times 10^{14}$ $cm^{-3}$, for example. The conductivity type of the impure substance added to the first portion 46 is not limited to the n type and can be p type, for example.

It is ideal that the impurity concentration of the first portion 46 and the impurity concentration of the second portion 48 differ from each other sufficiently. This is because it is not always easy to grow the crack 53 along the interface 50 in a case where the difference between the impurity concentration of the first portion 46 and the impurity concentration of the second portion 48 is insufficient. It is ideal that the impurity concentration of the first portion 46 is five-times or more than the impurity concentration of the second portion 48, for example. As stated above, in a case where the impurity concentrations are differ from each other sufficiently, the crack 53 can be reliably grown along the interface 50.

The impurity concentration of the first portion 46 is not limited to the five times or more relative to the impurity concentration of the second portion 48. In a case where the impurity concentration of the first portion 46 and the impurity concentration of the second portion 48 differ from each other to some extent, the crack 53 can grow along the interface 50. However, from a standpoint of reliably growing the crack 53, it is ideal that the impurity concentration of the first portion 46 is at least five-times or greater than the impurity concentration of the second portion 48.

he interface 50 between the first portion 46 and the second portion 48, of which the impurity concentrations differ from each other, can be obtained as described below, for example. For example, in a case where SiC ingot is grown in a sublimation method, a growth material is heated and evaporated so that the SiC is grown on a seed substrate. At this time, a concentration of impure substance added to the growth material can be appropriately set, and thus an impurity concentration distribution of the ingot in a direction which is perpendicular to a main surface of the seed substrate can be appropriately set. By growing the ingot as described above, the interface 50 between the first portion 46 and the second portion 48, of which the impurity concentrations differ from each other, is obtained.

The processing object 16 may be the ingot obtained as described above or the processing object 16 may be obtained by cutting the ingot obtained as described above into a desired shape. In addition, the processing object 16 is not limited to the ingot as long as the processing object 16 is formed with the predetermined interface 50 in advance.

In a case where the ingot including several alternate layers of the first portions 46 and the second portions 48 is placed on the stage, the processing object 16 including the several alternate layers of the first portions 46 and the second portions 48 is placed on the stage 18. However, in the present embodiment, attention is focused on the interface 50 between one of the first portions 46 and one of the second portions 48 to simplify the illustration and the description.

FIG. 3B illustrates a structure of the processing object 16 in a case where the processing object 16 corresponds to a processing object including a double structure where the second portion 48 exists above or on top of the first portion 46.

Thickness of the first portion 46 and thickness of the second portion 48 can be appropriately set so that the substrate including a desired thickness is obtained.

Next, the ultrashort-pulse laser light A is delivered to the planned laser irradiation range. The direction of irradiation of the ultrashort-pulse laser light A is the direction intersecting the in-plane direction of the interface 50. More specifically, the direction of irradiation of the ultrashort-pulse laser light A is the normal direction of the interface 50. On the other hand, the scanning direction of the ultrashort-pulse laser light A corresponds to an in-plane direction of the interface 50. The planned laser irradiation range (a laser irradiation range) is, for example, the entire interface 50 (an entire surface) between the first portion 46 and the second portion 48. During the scanning with the ultrashort-pulse laser light A relative to the planned laser irradiation range, the scanning of the planned laser irradiation range with the ultrashort-pulse laser light A creating the linear scanning locus is performed for plural times in such a manner that the linear scanning loci or linear scanning paths of the ultrashort-pulse laser light A are parallel to each other, and accordingly the ultrashort-pulse laser light A is delivered to the entire planned laser irradiation range. More specifically, as illustrated in FIG. 3A, in a first scanning, the ultrashort-pulse laser light A is scanned or delivered in a first direction. In the scanning performed after the first scanning, the ultrashort-pulse laser light A is scanned in a second direction that is a direction opposite to the first direction. A scan path of the ultrashort-pulse laser light A in a second scanning is offset relative to the scan path of the ultrashort-pulse laser light A which is made in the first scanning. In a third scanning, in a similar manner to the first scanning, the ultrashort-pulse laser light A is scanned in the first direction. A scan path of the ultrashort-pulse laser light A in the third scanning is offset relative to the scan path of the ultrashort-pulse laser light A which is made in the second scanning. Thereafter, the scanning is repeated in a similar manner, thereby performing the scanning with the ultrashort-pulse laser light A over the entire desired planned laser irradiation range. A scanning pitch of the ultrashort-pulse laser light A is approximately 1 μm to 50 μm, for example. The scanning pitch of the ultrashort-pulse laser light A is not limited to approximately 1 μm to 50 μm. The scanning pitch can be appropriately set depending on a size of the crack 53 grown in the in-plane direction of the interface 50 with a single scanning. In FIG. 3B, a locus 52 indicates a locus of portions at which the ultrashort-pulse laser light A is focused, that is, the plane defined or formed by connecting the focus points 55 of the ultrashort-pulse laser light A.

Figure 4A:
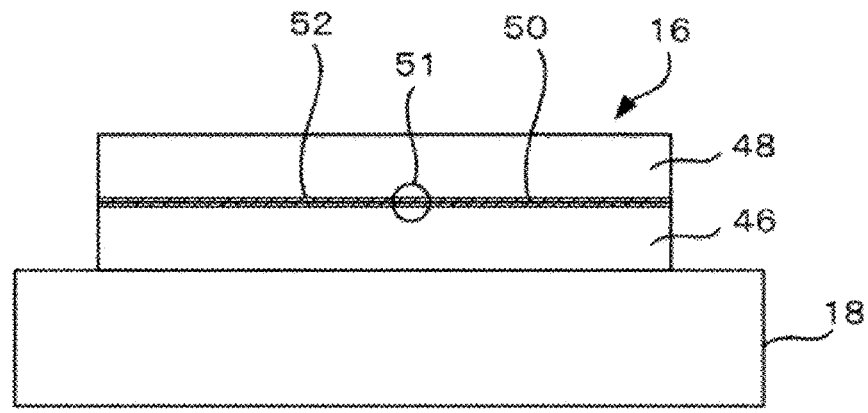
FIG. 4A is a view illustrating a process of the cutting method of the processing object and the manufacturing method of the substrate, according to the first embodiment.
Figure 4B:
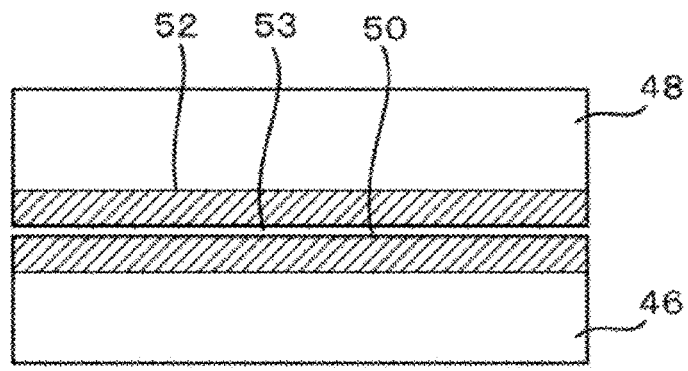
FIG. 4B is a view illustrating a process of the cutting method of the processing object and the manufacturing method of the substrate, according to the first embodiment.

FIG. 4A is a cross-sectional view illustrating a state where the irradiation of the ultrashort-pulse laser light A is completed relative to the entire planned laser irradiation range. FIG. 4B is an enlarged cross-sectional view illustrating a portion in FIG. 4A which is enclosed with a circle 51. As illustrated in FIG. 4B, the crack 53 grows along the interface 50. As described above and illustrated in the drawings, by delivering or irradiating the ultrashort-pulse laser light A to the predetermined interface 50 pre-formed at the processing object 16 or to the vicinity of the interface 50, the crack 53 can be grown or be generated along the interface 50.

In a case where the ultrashort-pulse laser light A is delivered to the predetermined interface 50 pre-formed at the processing object 16, which is formed with the interface 50, or delivered to the vicinity of the interface 50, the crack 53 can be grown and formed along the interface 50 (i.e., a crack forming process).

A mechanism in which the crack 53 grows at the interface 50 can be considered as follows, for example.

Figure 8A:
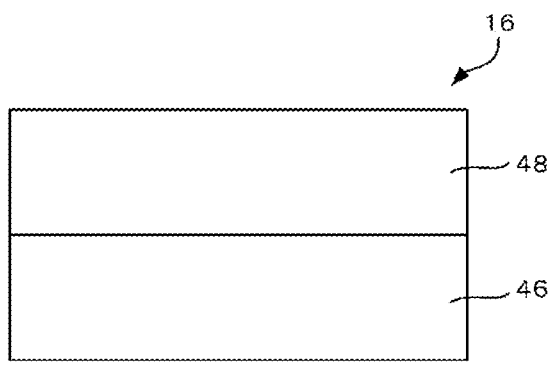
FIG. 8A is a cross-sectional view illustrating the processing object according to the embodiment.
Figure 8B:
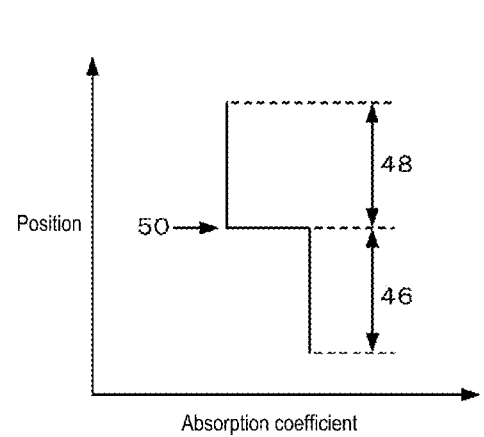
FIG. 8B is a graph illustrating a multiphoton absorption coefficient according to the embodiment.

A multiphoton absorption coefficient of the ultrashort-pulse laser light A at the first portion 46 corresponding to the portion of which the impurity concentration is relatively high and a multiphoton absorption coefficient of the ultrashort-pulse laser light A at the second portion 48 corresponding to the portion of which the impurity concentration is relatively low are different from each other. The multiphoton absorption coefficient indicates a likelihood of occurrence of multiphoton absorption. FIGS. 8A and 8B show the multiphoton absorption coefficient of the embodiment. FIG. 8A illustrates a cross section of the processing object of the present embodiment and FIG. 8B is a graph of the multiphoton absorption coefficient. A horizontal axis of the graph shown in FIG. 8B indicates the multiphoton absorption coefficient and a vertical axis of the graph shown in FIG. 8B indicates a position. As can be seen from FIG. 8B, at the first portion 46 corresponding to the portion of which the impurity concentration is relative high, the multiphoton absorption coefficient is relatively high. On the other hand, at the second portion 48 corresponding to the portion of which the impurity concentration is relative low, the multiphoton absorption coefficient is relatively low. Decomposition (a multiphoton decomposition reaction) occurs easily at the first portion 46 corresponding to the portion of which the multiphoton absorption coefficient is relative high, and the decomposition does not occur easily at the second portion 48 corresponding to the portion of which the multiphoton absorption coefficient is relative low. Thus, for example, in a case where the multiphoton decomposition reaction occurs at the first portion 46 corresponding to the portion of which the multiphoton absorption coefficient is relative high and the multiphoton decomposition reaction does not occur at the second portion 48 corresponding to the portion of which the multiphoton absorption coefficient is relative low, a portion where the decomposition has occurred is present in the vicinity of the interface 50 in the first portion 56. A crystal condition of the portion where the decomposition has occurred, that is, the portion where modification or reforming has occurred, is different from a crystal condition of a portion where the decomposition has not occurred. Because the plane (the scanning locus, the locus surface) formed by connecting the focus points 55 of the ultrashort-pulse laser light A is along the interface 50, a reformed layer (a decomposition layer) is generated along the interface 50. At the portion where the decomposition has occurred, not only the decomposition layer is formed but also cavities or air gaps are also generated. It is considered that such gaps, that is, air gaps, are connected to each other and accordingly the crack 53 is formed. The interface 50 serves as a guide to define or specify a direction in which the crack 53 grows, and as a result the crack 53 grows along the interface 50. In addition, it is considered that the crystal condition of a first side of the interface 50 and the crystal condition of a second side of the interface 50 being different from each other also contributes to the growth of the crack 53 along the interface 50.

In addition, the mechanism in which the crack 53 grows at the interface 50 can be considered as follows, for example.

When the ultrashort-pulse laser light A is delivered or irradiated, the ultrashort-pulse laser light A is reflected off the interface 50 and part of the ultrashort-pulse laser light A returns in a direction opposite to the direction of irradiation of the laser light A. At the interface 50 or in the vicinity of the interface 50, the intensity of the laser light A increases by an amount of the ultrashort-pulse laser light A which is reflected and returns. At a portion where the intensity of the laser light A increases, the intensity of the laser light A exceeds a threshold value of the decomposition of the material of the processing object 16 (a processing threshold value), and therefore the decomposition of the processing object 16 occurs at the portion where the intensity of the laser light A is increased. The decomposition occurs in the vicinity of the interface 50 because the laser light A is reflected at the interface 50. The crystal condition of the portion where the decomposition has occurred is different from the crystal condition of the portion where the decomposition has not occurred. Because the surface defined by connecting the focus points 55 of the ultrashort-pulse laser light A is along the interface 50, the decomposition layer is formed along the interface 50. At the position where the decomposition has occurred, not only the decomposition layer is formed but also the air gaps are generated. It is considered that the crack 53 is formed in a case where the air gaps are connected to each other. The interface 50 serves as the guide to define or specify the direction in which the crack 53 grows, and consequently the crack 53 grows along the interface 50.

In addition, it is also considered that the crack 53 is grown by a synergistic effect of the difference in the multiphoton absorption coefficients at the interface 50 and the reflection of the ultrashort-pulse laser light A at the interface 50.

As described above, the mechanism by which the crack 53 grows is not always clear, however, according to the present embodiment, the crack 53 can be grown along the predetermined interface 50 that is pre-formed at the processing object 16.

In a case where the interface is not formed in advance and the processing object is simply irradiated with the ultrashort-pulse laser light A, an appropriate crack does not grow because of the absence of an object which serves as the guide defining or specifying the direction in which the crack grows.

At a phase at which the crack 53 is formed, the processing object 16 is not always reliably separated at the crack 53. In a case where the processing object 16 is not surely separated at the crack 53, the processing object 16 is separated in a manner described below, for example. Here, description is made on a case where an external force in a direction along the in-plane direction of the interface 50 between the first portion 46 and the second portion 48 is applied to the processing object 16.

Figure 4C:
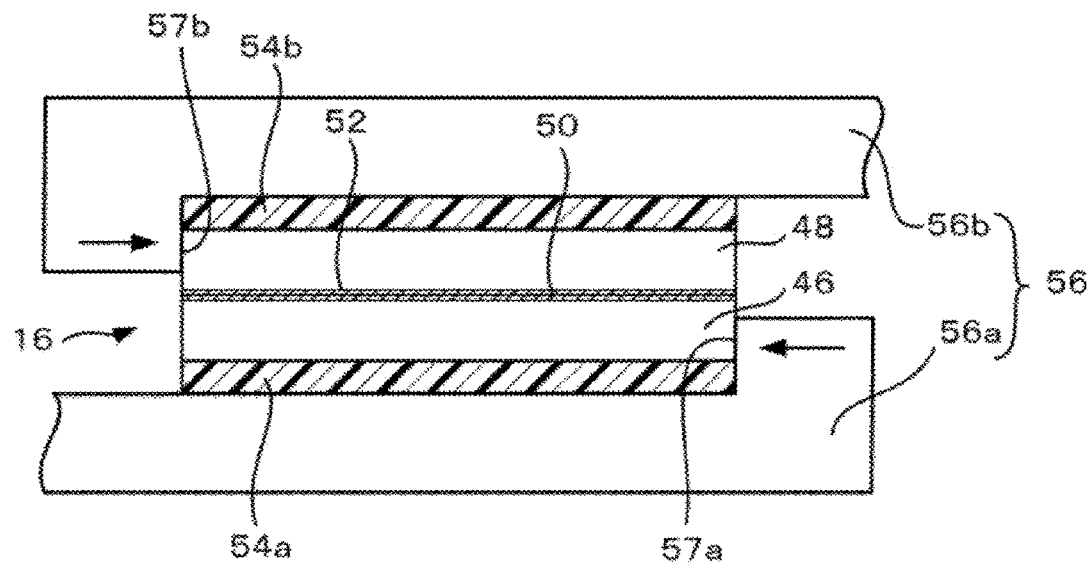
FIG. 4C is a view illustrating a process of the cutting method of the processing object and the manufacturing method of the substrate, according to the first embodiment.

FIG. 4C is a cross-sectional view illustrating a state where the external force in the direction along the in-plane direction of the interface 50 is applied to the processing object 16. As illustrated in FIG. 4C, a jig 56 is prepared. The jig 56 includes a member 56a including a protrusion 57a formed at an upper surface of the member 56a and a member 56b including a protrusion 57b formed at a bottom surface of the member 56b. For example, aluminum alloy may be used as material of the members 56a and 56b. For example, a surface protection film 54a is provided between a bottom surface of the processing object 16 and the upper surface of the member 56a. In addition, a surface protection film 54b is provided between an upper surface of the processing object 16 and the bottom surface of the member 56b, for example. For example, polyimide may be used as material of the surface protection films 54a and 54b. Each of the surface protection films 54a and 54b is also referred to as a polyimide tape. It is ideal that a height of the protrusion 57a is set in such a manner that an upper surface of the protrusion 57a is positioned lower than the interface 50. In addition, it is ideal that a height of the protrusion 57b is set in such a manner that a bottom surface of the protrusion 57b is positioned higher than the interface 50. The protrusion 57a of the member 56a is in contact with one side (for example, the right side on the paper surface on which FIG. 4C is drawn) of the processing object 16 and the protrusion 57b of the member 56b is in contact with the other side (for example, the left side on the paper surface on which FIG. 4C is drawn) of the processing object 16. The external force in the direction along the in-plane direction of the interface 50 is applied to the processing object 16 with the use of the jig 56. Each of the arrows with the straight lines illustrated in FIG. 4C indicates the direction of the external force applied to the processing object 16. As illustrated in FIG. 4C, the external force in the direction in which the protrusion 57a and the protrusion 57b come close to each other is applied to the processing object 16.

Figure 5A:
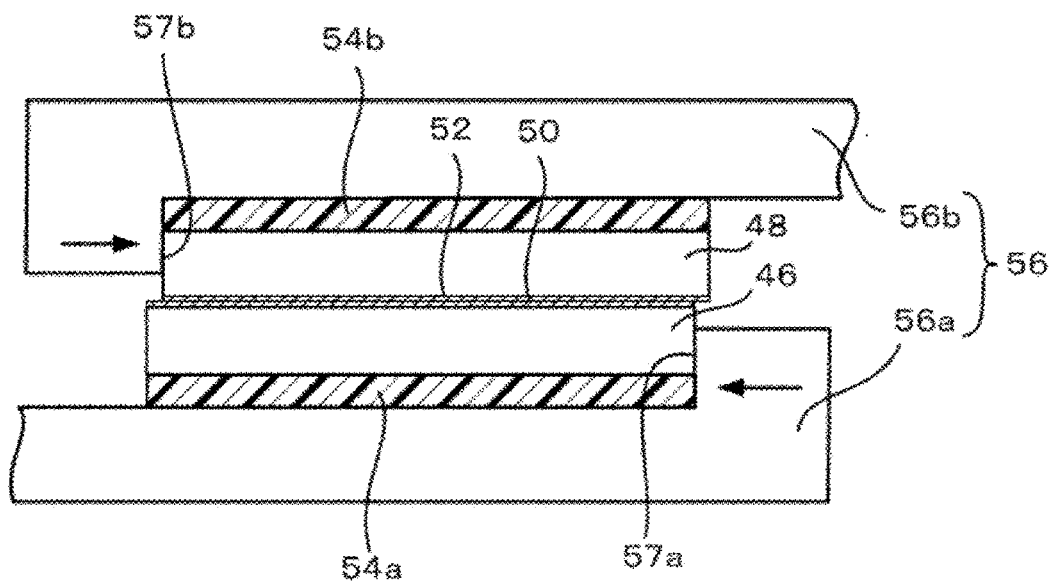
FIG. 5A is a view illustrating a process of the cutting method of the processing object and the manufacturing method of the substrate, according to the first embodiment.

FIG. 5A is a cross-sectional view illustrating a state where the processing object 16 is separated at the crack 53 as a result of application of the external force in the direction along the in-plane direction of the interface 50. Thus, in a case where the external force in the direction along the in-plane direction of the interface 50 is applied to the processing object 16, the processing object 16 is separated at the crack 53. According to the present embodiment, the processing object 16 can be separated at the crack easily and precisely (i.e., a separating process).

Figure 5B:
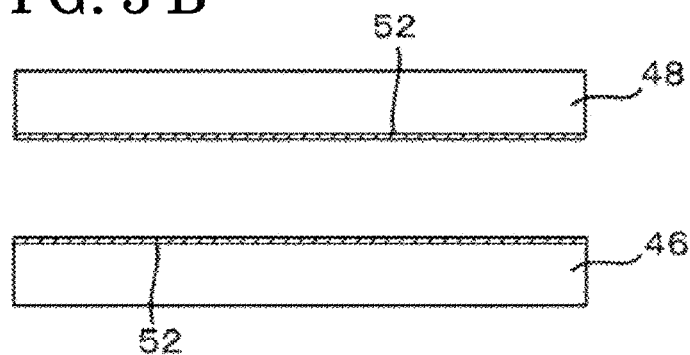
FIG. 5B is a view illustrating a process of the cutting method of the processing object and the manufacturing method of the substrate, according to the first embodiment.

FIG. 5B illustrates a state where each of the first portion 46 and the second portion 48 is taken out of the jig 56.

Figure 5C:
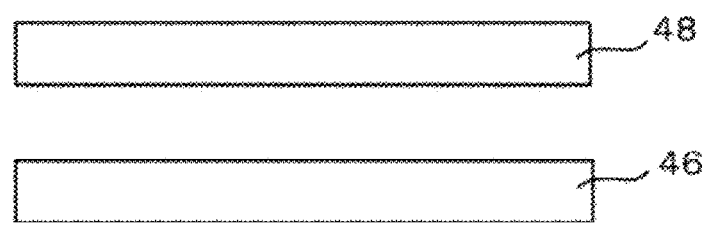
FIG. 5C is a view illustrating a process of the cutting method of the processing object and the manufacturing method of the substrate, according to the first embodiment.

Next, as illustrated in FIG. 5C, a portion of the first portion 46, the portion which is at a side of the interface 50, is removed by grinding or polishing. In addition, a portion of the second portion 48, the portion which is at a side of the interface 50, is removed by grinding or polishing. Thus, a first substrate 46 (i.e., the substrate) and a second substrate 48 (i.e., the substrate) are obtained. The first substrate 46 is formed from the first portion 46 corresponding to a first-side portion of the processing object 16 which is separated. The second substrate 48 is formed from the second portion 48 corresponding to a second-side portion of the processing object 16 which is separated. Thickness of the obtained first substrate 46 is approximately 300 µm, for example. Thickness of the obtained second substrate 48 is also approximately 300 µm, for example. The thickness of the first substrate 46 and/or the second substrate 48 is not limited to approximately 300 µm. The first substrate 46 and/or the second substrate 48 each including various thicknesses can be formed.

As described above, the substrate can be manufactured in the cutting method of the processing object according to the present embodiment. The cutting method of the processing object according to the present embodiment provides an extremely high processing precision and accuracy, and therefore the substrates 46 and 48 each including extremely small surface irregularities or ruggedness can be obtained. In addition, the cutting method of the processing object according to the present embodiment provides the extremely high processing precision and accuracy, and therefore a portion in the processing object 16 which is wasted is appropriately reduced, which contributes to cost reduction, for example.

Figure 9:
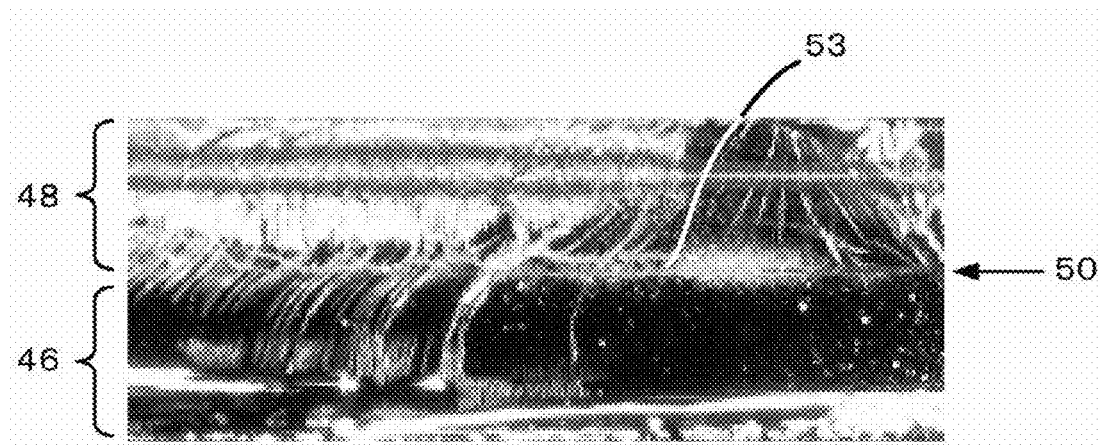
FIG. 9 is a view illustrating a scanning electron microscope image of a cross section of the processing object at which a crack is formed according to the embodiments disclosed here.

Next, evaluation results of the cutting method of the processing object according to the present embodiment will be described with reference to FIG. 9. FIG. 9 is a view showing an optical microscope photograph of a cross section of the processing object at which the crack is formed.

In evaluating the cutting method of the processing object, the $n^+$ type SiC is used as the first portion 46 and the i type SiC is used as the second portion 48. As can be seen from FIG. 9, the crack 53 is reliably formed along the interface 50 between the first portion 46 and the second portion 48.

Thus, according to the present embodiment, the crack 53 can be reliably grown along the predetermined interface 50 that is formed in advance at the processing object 16.

Next, variations of the processing object according to the present embodiment will be described with reference to FIGS. 8A, 8B, 10A and 10B.

First, a first variation of the processing object according to the present embodiment will be described with reference to FIGS. 8A and 8B. In the first variation of the processing object according to the present embodiment, the first portion 46 is added with a high concentration of impure substance and the second portion 48 is added with a low concentration of impure substance. A conductivity type of the first portion 46 is $n^+$ type, for example. The impurity concentration at the first portion 46 is approximately $1 \times 10^{18}$ to $1 \times 10^{21}$ cm$^{-3}$, for example. A conductivity type of the second portion 48 is $n^-$ type, for example. The impurity concentration at the second portion 48 is approximately $1 \times 10^{15}$ to $1 \times 10^{17}$ cm$^{-3}$, for example.

As illustrated in FIG. 8B, the multiphoton absorption coefficient at the first portion 46 is relatively high and the multiphoton absorption coefficient at the second portion 48 is relatively low. A difference in the multiphoton absorption coefficients exists between the first portion 46 and the second portion 48.

In the first variation of the processing object according to the present embodiment, the impurity concentration of the first portion 46 corresponding to the first side relative to the interface 50 and the impurity concentration of the second portion 48 corresponding to the second side relative to the interface 50 are different from each other. Thus, the crack 53 is reliably formed at the interface 50 between the first portion 46 and the second portion 48.

Here, the explanation is made on the case where the conductivity type of the first portion 46 is $n^+$ type and the conductivity type of the second portion 48 is $n^-$ type, however, the conductivity types are not limited thereto. The conductivity type of the first portion 46 may be $p^+$ type and the conductivity type of the second portion 48 may be $p^-$ type. Alternatively, the conductivity type of the first portion 46 may be $n^+$ type and the conductivity type of the second portion 48 may be i type. Alternatively, the conductivity type of the first portion 46 may be $p^+$ type and the conductivity type of the second portion 48 may be i type.

Figure 10B:
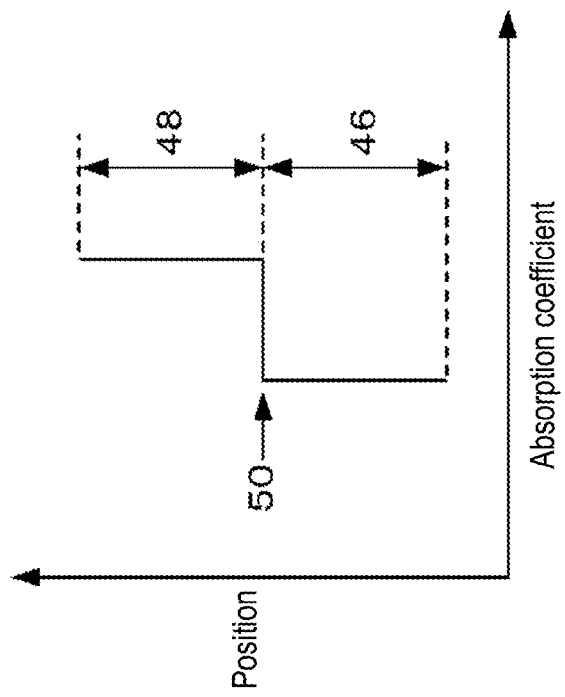
FIG. 10B is a graph illustrating a multiphoton absorption coefficient according to the embodiment.
Figure 10A:
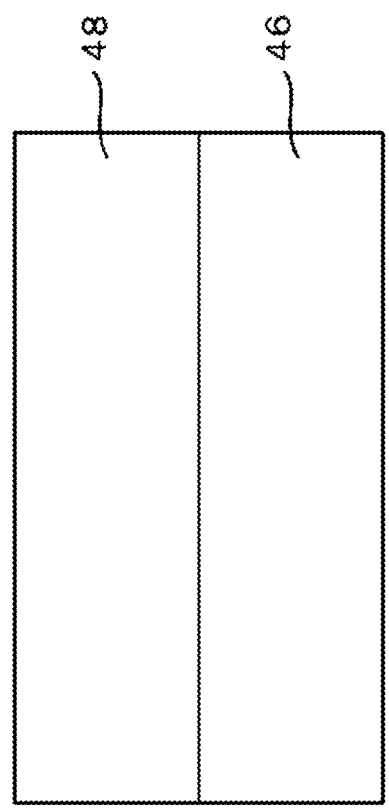
FIG. 10A is a cross-sectional view illustrating the processing object according to the embodiment.

A second variation of the processing object according to the present embodiment will be described with reference to FIGS. 10A and 10B. FIG. 10A illustrates a cross section of the second variation of the processing object of the present embodiment. FIG. 10B is a graph of the multiphoton absorption coefficient of the second variation of the processing object of the present embodiment. A horizontal axis of the graph shown in FIG. 10B indicates the multiphoton absorption coefficient and a vertical axis of the graph shown in FIG. 10B indicates a position.

In the second variation of the processing object according to the present embodiment, the first portion 46 is added with a low concentration of impure substance and the second portion 48 is added with a high concentration of impure substance. A conductivity type of the first portion 46 is n⁻ type, for example. The impurity concentration at the first portion 46 is approximately $1 \times 10^{15}$ to $1 \times 10^{17}$ cm$^{-3}$, for example. A conductivity type of the second portion 48 is n⁺ type, for example. The impurity concentration at the second portion 48 is approximately $1 \times 10^{18}$ to $1 \times 10^{21}$ cm$^{-3}$, for example.

As illustrated in FIG. 10B, the multiphoton absorption coefficient at the first portion 46, which is at the first side relative to the interface 50, is set to be relatively low and the multiphoton absorption coefficient at the second portion 48, which is at the second side relative to the interface 50, is relatively high. A difference in the multiphoton absorption coefficients exists between the first portion 46 and the second portion 48.

In the second variation of the processing object according to the present embodiment, the impurity concentration of the first portion 46 corresponding to the first side relative to the interface 50 and the impurity concentration of the second portion 48 corresponding to the second side relative to the interface 50 are different from each other. Thus, the crack 53 is reliably formed at the interface 50 between the first portion 46 and the second portion 48.

Here, the explanation is made on the case where the conductivity type of the first portion 46 is n⁻ type and the conductivity type of the second portion 48 is n⁺ type, however, the conductivity types are not limited thereto. The conductivity type of the first portion 46 may be p⁻ type and the conductivity type of the second portion 48 may be p⁺ type. Alternatively, the conductivity type of the first portion 46 may be i type and the conductivity type of the second portion 48 may be n⁺ type. Alternatively, the conductivity type of the first portion 46 may be i type and the conductivity type of the second portion 48 may be p⁺ type.

As described above, according to the present embodiment, the ultrashort-pulse laser light A is delivered in such a manner that the focus point 55 of the ultrashort-pulse laser light A is positioned at the interface 50 between the first portion of the processing object 16 and the second portion of the processing object 16 or in such a manner that the focus point 55 is positioned in the vicinity of the interface 50. The impurity concentration of the first portion and the impurity concentration of the second portion are different from each other. Alternatively, the material of the first portion and the material of the second portion are different from each other. Thus, according to the present embodiment, the processing object 16 can be cut at the crack 53 formed along the interface 50 accurately. In addition, according to the present embodiment, the processing object 16 can be cut quickly even in a case where the processing object is hard. Therefore, the present embodiment provides the cutting method of the processing object in which the processing object can be cut at the desired portion quickly and precisely, and the manufacturing method of, for example, the substrate in which the cutting method is used.

According to the present embodiment, the processing accuracy is extremely high, and thus the article, for example, the substrates 46 and 48, including the extremely small irregularities is obtained. In addition, according to the present embodiment, the thickness of the portion in the processing object 16 which is wasted is extremely thin, thereby contributing to cost reduction, for example.

A cutting method of a processing object and a manufacturing method of a substrate according to a second embodiment disclosed here will be described with reference to FIGS. 11A, 11B, 12A and 12B. Each of FIGS. 11A, 11B, 12A and 12B is a view illustrating a process of the cutting method of the processing object and the manufacturing method of the substrate, according to the present embodiment. In FIGS. 11A, 11B, 12A and 12B, the same reference numerals designate the same or corresponding components of the first embodiment illustrated in FIGS. 1 to 10, and description thereof may be omitted or simplified.

In the cutting method of the processing object and the manufacturing method of the substrate according to the present embodiment, each of first portions 58a, 58b, 58c, 58d and 58e includes a first impurity concentration and each of second portions 60a, 60b, 60c and 60d includes a second impurity concentration which is different from the first impurity concentration. The first portions 58a, 58b, 58c, 58d and 58e are layered on one another via the second portions 60a, 60b, 60c and 60d. That is, the first portions 58a, 58b, 58c, 58d and 58e are layered on one another in a manner that the second portions 60a, 60b, 60c and 60d are interposed between the first portions 58a, 58b, 58c, 58d and 58e, respectively.

Figure 11A:
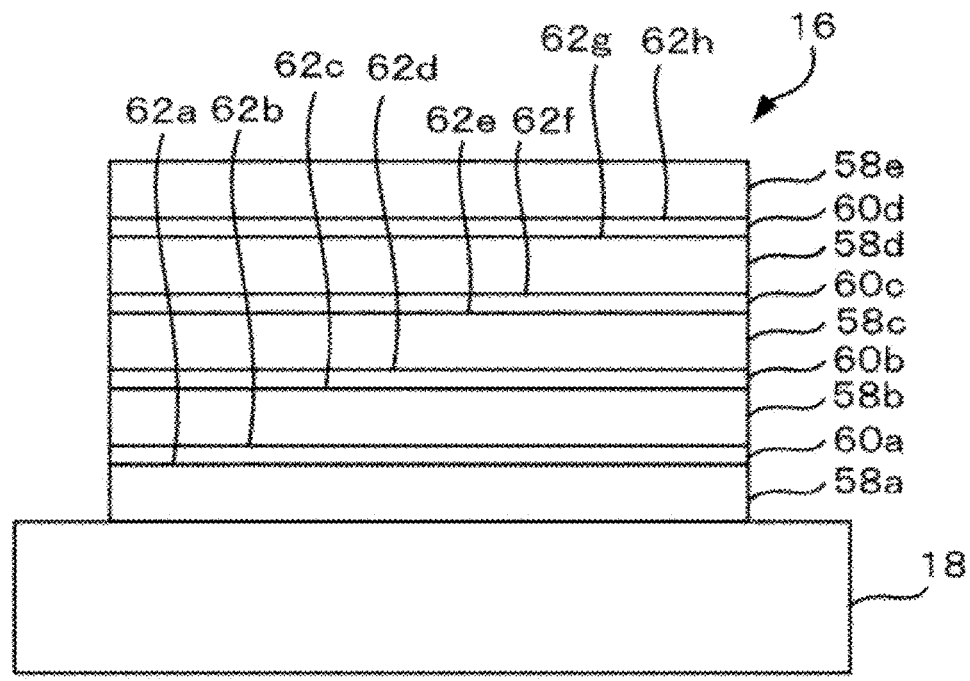
FIG. 11A is a view illustrating a process of a cutting method of a processing object and a manufacturing method of a substrate, according to a second embodiment disclosed here.

First, as illustrated in FIG. 11A, the processing object 16 is placed on the stage 18. In a similar manner to the cutting method of the processing object according to the first embodiment, the material of the processing object 16 is not limited to a particular material. Here, for example, SiC is used as the material of the processing object 16.

Interfaces 62a, 62b, 62c, 62d, 62e, 62f, 62g and 62h are formed at the processing object 16 in advance. The interfaces 62a to 62h are formed to be apart from each other in a normal direction thereof. The interfaces 62a to 62h are interfaces or boundary surfaces between the first portions 58a to 58e and the corresponding second portions 60a to 60d. For example, an impurity concentration of the first portions 58a to 58e and an impurity concentration of the second portions 60a to 60d differ from each other. The impurity concentration of the first portions 58a to 58e is set to be a relatively low concentration. More specifically, a conductivity type of the first portions 58a to 58e is i type, for example. The impurity concentration at the first portions 58a to 58e is approximately $1 \times 10^{14}$ cm$^{-3}$, for example. On the other hand, a conductivity type of the second portions 60a to 60d is n⁺ type, for example. The impurity concentration at the second portions 60a to 60d is approximately $1 \times 10^{18}$ to $10^{21}$ cm$^{-3}$, for example. The conductivity type of impure substance added to the second portions 60a to 60d is not limited to n type and may be p type, for example. As described above in the first embodiment, it is ideal that the impurity concentration of the first portions 58a to 58e and the impurity concentration of the second portions 60a to 60d differ from each other sufficiently.

The interfaces 62a to 62h between the first portions 58a to 58e and the second portions 60a to 60d (the impurity concentration of the first portions 58a to 58e and the impurity concentration of the second portions 60a to 60d differ from each other) can be obtained as described below, for example. As described above in the first embodiment, in a case where the SiC ingot is grown in the sublimation method, the growth material is heated and evaporated so that the SiC is grown on the seed substrate. At this time, the concentration of impure substance added to the growth material can be appropriately set, and accordingly the impurity concentration distribution of the ingot in the direction which is perpendicular to the main surface of the seed substrate can be appropriately set. By growing the ingot as described above, the interfaces 62a to 62h between the first portions 58a to 58e and the second portions 60a to 60d, of which the impurity concentrations differ from each other, are obtained.

As described above in the first embodiment, the processing object 16 may be the ingot obtained as described above or the processing object 16 may be obtained by cutting in advance the ingot obtained as described above into a desired shape. In addition, the processing object 16 is not limited to ingot as long as the processing object 16 is formed with the predetermined interfaces 62a to 62h in advance.

For example, in a case where thickness of the first portions 58a to 58e and/or the second portions 60a to 60d is set at approximately several hundreds of μm to several tens of μm, the ingot includes the plural first portions 58a to 58e in a state where the first portions 58a to 58e are layered on one another via the second portions 60a to 60d. Here, however, five of the first portions 58a to 58e and four of the second portions 60a to 60d are illustrated in the drawings to simplify the description.

FIG. 11A illustrates a structure of the processing object 16 in a case where the processing object 16 is constituted by the five first portions 58a to 58e and the four second portions 60a to 60d.

The thickness of the first portions 58a to 58e can be appropriately set so that a desired substrate is obtained. It is ideal that the second portions 60a to 60d are sufficiently thin relative to the first portions 58a to 58e because the second portions 60a to 60d are removed at a later process or a downstream process.

Figure 12A:
FIG. 12A is a view illustrating a process of the cutting method of the processing object and the manufacturing method of the substrate, according to the second embodiment.
Figure 12B:
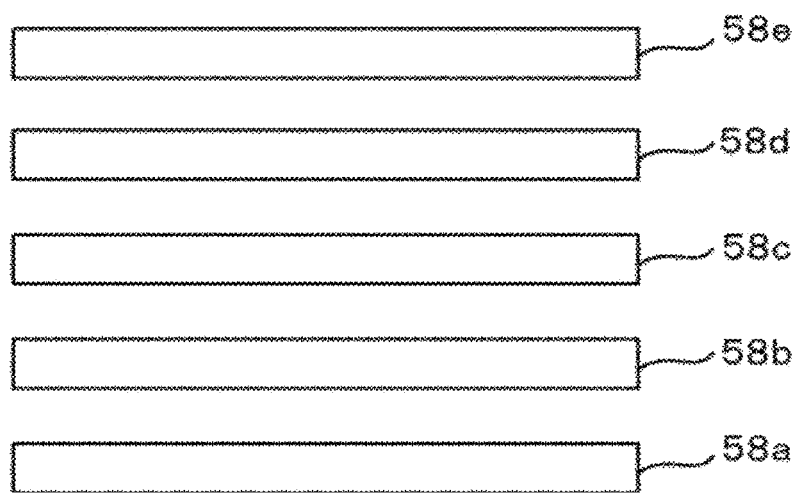
FIG. 12B is a view illustrating a process of the cutting method of the processing object and the manufacturing method of the substrate, according to the second embodiment.

Next, the ultrashort-pulse laser light A is delivered or irradiated to a first planned laser irradiation range (refer to FIG. 12B). For example, the first planned laser irradiation range is the entire interface 62a (an entire surface) between the first portion 58a of a first layer and the second portion 60a of the first layer, or the entire vicinity (an entire surface) of the interface 62a. That is, in the present embodiment, the irradiation with the ultrashort-pulse laser light A is performed sequentially from a low-layer side. A reason for performing the irradiation of the ultrashort-pulse laser light A from the low-layer side is as follows. In a case where the ultrashort-pulse laser light A is delivered to a layer, the reformed layer is formed at the layer and thus it is difficult for the ultrashort-pulse laser light A to reach a lower side relative to the layer. Accordingly, in a case where the irradiation with the ultrashort-pulse laser light A is performed sequentially from an upper-layer side, the ultrashort-pulse laser light A is blocked by the reformed layer formed at the upper-layer side, and thus the ultrashort-pulse laser light A cannot be delivered to the low-layer side. Consequently, the irradiation with the ultrashort-pulse laser light A is performed sequentially from the low-layer side. The direction of irradiation of the ultrashort-pulse laser light A is the direction intersecting an in-plane direction of the interface 62a. More specifically, the direction of irradiation of the ultrashort-pulse laser light A is a normal direction of the interface 62a. On the other hand, the scanning direction of the ultrashort-pulse laser light A is the in-plane direction of the interface 62a. The scanning with the ultrashort-pulse laser light A is performed in a similar manner to the scanning with the ultrashort-pulse laser light A which is described with reference to FIG. 3B in the first embodiment, and thus the description thereof will be omitted here. Thus, by delivering or irradiating the ultrashort-pulse laser light A to the predetermined interface 62a pre-formed at the processing object 16 or to the vicinity of the interface 62a, the crack 53 can be grown or be generated along the interface 62a so as to follow the interface 62a.

Here, the description is made on a case where the ultrashort-pulse laser light A is delivered to the interface 62a between the first portion 58a of the first layer and the second portion 60a of the first layer, however, the irradiation is not limited thereto. For example, the ultrashort-pulse laser light A can be delivered to the interface 62b between the second portion 60a of the first layer and the first portion 58b of a second layer. In a case where the ultrashort-pulse laser light A is delivered to the interface 62b between the second portion 60a of the first layer and the first portion 58b of the second layer, or to the vicinity of the interface 62b, the crack 53 can be grown along the interface 62b so as to follow the interface 62b.

Figure 11B:
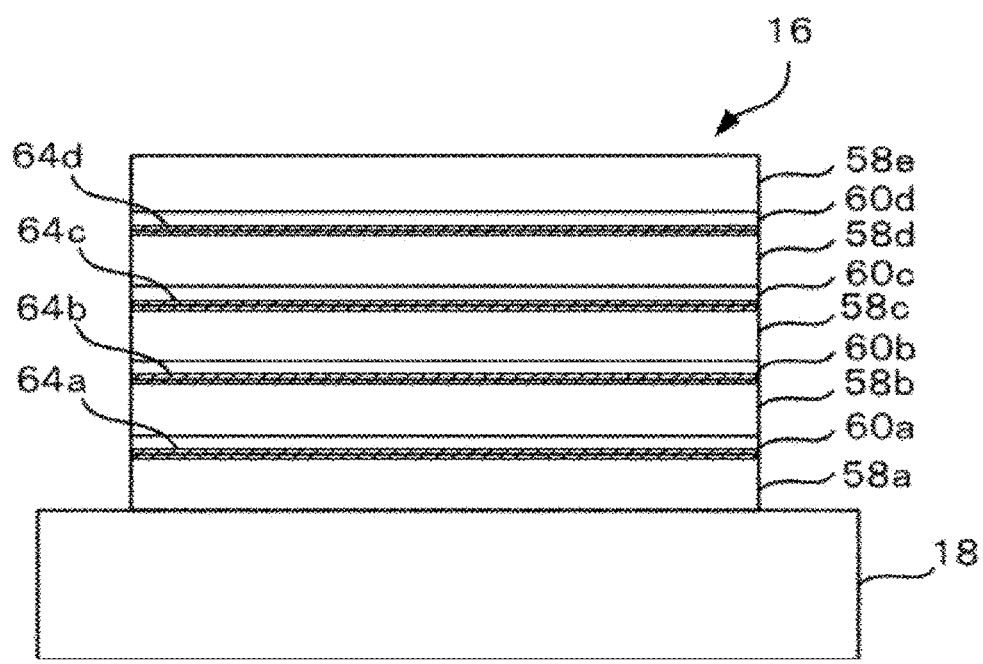
FIG. 11B is a view illustrating a process of the cutting method of the processing object and the manufacturing method of the substrate, according to the second embodiment.

The plane formed or defined by connecting the focus points 55 of the ultrashort-pulse laser light A (that is, the scanning locus, the locus surface) is formed along the interface 62a, and the reformed layer is formed along the interface 62a. In addition, at the interface 62a or in the vicinity of the interface 62a, the crack 53 (refer to FIG. 4B) is formed along the interface 62a. In FIG. 11B, a locus 64a indicates the locus of portions at which the ultrashort-pulse laser light A is focused, that is, the plane defined or formed by connecting the focus points 55 of the ultrashort-pulse laser light A.

Next, the ultrashort-pulse laser light A is delivered or irradiated to a second planned laser irradiation range. For example, the second planned laser irradiation range is the entire interface 62c (an entire surface) between the first portion 58b of the second layer and the second portion 60b of the second layer, or the entire vicinity (an entire surface) of the interface 62c. Thus, by delivering or irradiating the ultrashort-pulse laser light A to the predetermined interface 62c pre-formed at the processing object 16 or to the vicinity of the interface 62c, the crack 53 can be grown or be generated along the interface 62c so as to follow the interface 62c.

Here, the description is made on a case where the ultrashort-pulse laser light A is delivered or irradiated to the interface 62c between the first portion 58b of the second layer and the second portion 60b of the second layer, however, the irradiation is not limited thereto. For example, the ultrashort-pulse laser light A can be delivered to the interface 62d between the second portion 60b of the second layer and the first portion 58c of a third layer. In a case where the ultrashort-pulse laser light A is delivered to the interface 62d between the second portion 60b of the second layer and the first portion 58c of the third layer, or to the vicinity of the interface 62d, the crack 53 can be grown along the interface 62d so as to follow the interface 62d.

The plane defined or formed by connecting the focus points 55 of the ultrashort-pulse laser light A (that is, the scanning locus, the locus surface) is along the interface 62c, and the reformed layer is formed along the interface 62c. In addition, at the interface 62c or in the vicinity of the interface 62c, the crack 53 (refer to FIG. 4B) is formed along the interface 62c. In FIG. 11B, a locus 64b indicates the locus of portions at which the ultrashort-pulse laser light A is focused, that is, the plane defined or formed by connecting the focus points 55 of the ultrashort-pulse laser light A.

Thereafter, the irradiation with the ultrashort-pulse laser light A is further performed in a similar manner to the above-described manner. In a case where the first portion and the second portion are still further layered alternately with each other, the ultrashort-pulse laser light A may be further delivered in a similar manner to the above-described manner. In FIG. 11B, each of a locus 64c and a locus 64d indicates the locus of portions at which the ultrashort-pulse laser light A is focused, that is, the surface formed by connecting the focus points 55 of the ultrashort-pulse laser light A.

The second portions 60a to 60d are removed at the later process and the first portions 58a to 58e are used as the substrates. From a standpoint of reducing the waste of material, it is ideal that the reformed layers and/or the cracks are formed within the second portions 60a to 60d. There is a high probability that the reformed layers and/or the cracks are formed within the second portions 60a to 60d because the multiphoton absorption coefficient is relatively high at the second portions 60a to 60d and the reflection of the ultrashort-pulse laser light A occurs at the interfaces 62a, 62c, 62e and 62g.

As described above in the first embodiment, at the phase at which the crack 53 is formed, the processing object 16 is not always reliably separated at the crack 53. In a case where the processing object 16 is not surely separated at the crack 53, the processing object 16 is separated, for example, in a manner similar to the first embodiment. The jig 56 can be appropriately modified to fit or match the processing object 16 of the present embodiment.

FIG. 12A is a cross-sectional view illustrating a state where the processing object 16 is separated at the cracks 53.

Next, a bottom surface and/or an upper surface of each of the first portions 58a to 58e is ground or polished. Accordingly, as illustrated in FIG. 12B, a first substrate 58a formed from the first portion 58a of the first layer, a second substrate 58b formed from the first portion 58b of the second layer, and a third substrate 58c formed from the first portion 58c of the third layer are obtained. In addition, a fourth substrate 58d formed from the first portion 58d of a fourth layer and a fifth substrate 58e formed from the first portion 58e of a fifth layer are obtained. In a case where the processing object includes n pieces of the first portions (n is a positive integer), n pieces of substrates are obtained. Each of the first substrate 58a to the firth substrate 58e serves as the substrate.

As described above, the substrate is manufactured by using the cutting method of the processing object according to the present embodiment.

Next, variations of the processing object according to the present embodiment will be described with reference to FIGS. 13A, 13B, 14A and 14B.

Each of FIGS. 13A and 13B is a view illustrating a first variation of the processing object according to the present embodiment. FIG. 13A illustrates a cross section of the processing object and FIG. 13B is a graph of the multiphoton absorption coefficient of the processing object. A horizontal axis of the graph shown in FIG. 13B indicates the multiphoton absorption coefficient and a vertical axis of the graph shown in FIG. 13B indicates a position.

In the first variation of the processing object according to the present embodiment, the first portions 58a to 58e are added with a low concentration of impure substance and the second portions 60a to 60d are is added with a high concentration of impure substance. A conductivity type of the first portions 58a to 58e is n⁻ type, for example. The impurity concentration at the first portions 58a to 58e is approximately $1\times10^{15}$ to $1\times10^{17}$ cm$^{-3}$, for example. A conductivity type of the second portions 60a to 60d is n⁺ type, for example. The impurity concentration at the second portions 60a to 60d is approximately $1\times10^{18}$ to $1\times10^{21}$ cm$^{-3}$, for example.

As illustrated in FIG. 13B, the multiphoton absorption coefficient at the first portions 58a to 58e is relatively low and the multiphoton absorption coefficient at the second portions 60a to 60d is relatively high. A difference in the multiphoton absorption coefficients exists between the first portions 58a to 58e and the second portions 60a to 60d.

According to the first variation of the processing object of the present embodiment, the multiphoton absorption coefficient at the first portions 58a to 58e is set to be relatively low and the multiphoton absorption coefficient at the second portions 60a to 60d is set to be relatively high. Thus, by delivering the ultrashort-pulse laser light A to the interfaces 62a to 62h between the first portions 58a to 58e and the second portions 60a to 60d, or to the vicinities of the interfaces 62a to 62h, the cracks 53 can be reliably formed along the interfaces 62a to 62h so as to follow the interfaces 62a to 62h.

Here, the description is made on a case where the conductivity type of the first portions 58a to 58e is n⁻ type and the conductivity type of the second portions 60a to 60d is n⁺ type, however, the conductivity types are not limited thereto. The conductivity type of the first portions 58a to 58e may be p⁻ type and the conductivity type of the second portions 60a to 60d may be p⁺ type. Alternatively, the conductivity type of the first portions 58a to 58e may be i type and the conductivity type of the second portions 60a to 60d may be n⁺ type. Alternatively, the conductivity type of the first portions 58a to 58e may be i type and the conductivity type of the second portions 60a to 60d may be p⁺ type.

Figure 14A:
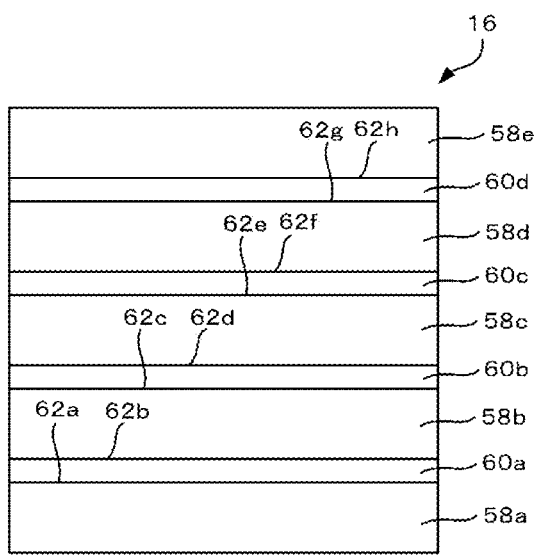
FIG. 14A is a view illustrating a processing object according to a second variation of the second embodiment.
Figure 14B:
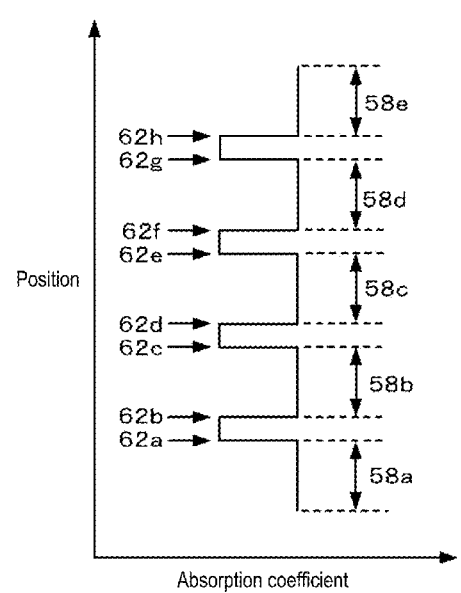
FIG. 14B is a view illustrating the processing object according to the second variation of the second embodiment.

Each of FIGS. 14A and 14B is a view illustrating a second variation of the processing object according to the second embodiment. FIG. 14A illustrates a cross section of the processing object and FIG. 14B is a graph of the multiphoton absorption coefficient of the processing object. A horizontal axis of the graph shown in FIG. 14B indicates the multiphoton absorption coefficient and a vertical axis of the graph shown in FIG. 14B indicates a position.

In the second variation of the processing object according to the present embodiment, the first portions 58a to 58e are added with a high concentration of impure substance and the second portions 60a to 60d are added with a low concentration of impure substance. A conductivity type of the first portions 58a to 58e is n⁺ type, for example. The impurity concentration at the first portions 58a to 58e is approximately $1\times10^{18}$ to $1\times10^{21}$ cm$^{-3}$, for example. A conductivity type of the second portions 60a to 60d is n⁻ type, for example. The impurity concentration at the second portions 60a to 60d is approximately $1\times10^{15}$ to $1\times10^{17}$ cm$^{-3}$, for example.

As illustrated in FIG. 14B, the multiphoton absorption coefficient at the first portions 58a to 58e is relatively high and the multiphoton absorption coefficient at the second portions 60a to 60d is relatively low. A difference in the multiphoton absorption coefficients exists between the first portions 58a to 58e and the second portions 60a to 60d.

According to the second variation of the processing object of the present embodiment, the multiphoton absorption coefficient at the first portions 58a to 58e is set to be relatively high and the multiphoton absorption coefficient at the second portions 60a to 60d is set to be relatively low. Thus, by delivering the ultrashort-pulse laser light A to the interfaces 62a to 62h between the first portions 58a to 58e and the corresponding second portions 60a to 60d, or to the vicinities of the interfaces 62a to 62h, the cracks 53 can be reliably formed along the interfaces 62a to 62h so as to follow the interfaces 62a to 62h.

Here, the description is made on a case where the conductivity type of the first portions 58a to 58e is n+ type and the conductivity type of the second portions 60a to 60d is n− type, however, the conductivity types are not limited thereto. The conductivity type of the first portions 58a to 58e may be p+ type and the conductivity type of the second portions 60a to 60d may be p− type. Alternatively, the conductivity type of the first portions 58a to 58e may be n+ type and the conductivity type of the second portions 60a to 60d may be i type. Alternatively, the conductivity type of the first portions 58a to 58e may be p+ type and the conductivity type of the second portions 60a to 60d may be i type.

As described above, the processing object 16, which includes the first portions 58a, 58b, 58c, 58d, 58e and the second portions 60a, 60b, 60c, 60d that are layered on one another in such a manner that the first portion and the second portion alternate, can be cut. The first portions 58a, 58b, 58c, 58d and 58e includes the first impurity concentration and the second portions 60a, 60b, 60c and 60d includes the second impurity concentration. Also according to the present embodiment, the predetermined interfaces 62a to 62h are pre-formed at the processing object 16, and the ultrashort-pulse laser light A is delivered in such a manner that the focus point 55 of the ultrashort-pulse laser light A is positioned at the interfaces 62a to 62h or the vicinities of the interfaces 62a to 62h. Thus, according also to the present embodiment, the processing object 16 can be cut at the cracks 53 formed with the high precision along the interfaces 62a to 62h. In addition, according also to the present embodiment, the processing object 16 can be cut quickly. Therefore, also the present embodiment provides the cutting method of the processing object in which the processing object can be cut at the desired portion quickly and precisely, and the manufacturing method of, for example, the substrate where the cutting method is used.

A cutting method of a processing object and a manufacturing method of a substrate according to a third embodiment disclosed here will be described with reference to FIGS. 15A, 15B, 16A, 16B and 16C. Each of FIGS. 15A, 15B, 16A, 16B and 16C is a view illustrating a process of the cutting method of the processing object and the manufacturing method of a semiconductor device, according to the present embodiment. In FIGS. 15A to 16C, the same reference numerals designate the same or corresponding components of the first or second embodiment illustrated in FIGS. 1 to 14B and description thereof may be omitted or simplified.

The cutting method of the processing object and the manufacturing method of the substrate according to the present embodiment is for performing the cutting at the interface 78 between the portion 70 and the portion 72 of which the materials differ from each other.

Figure 15A:
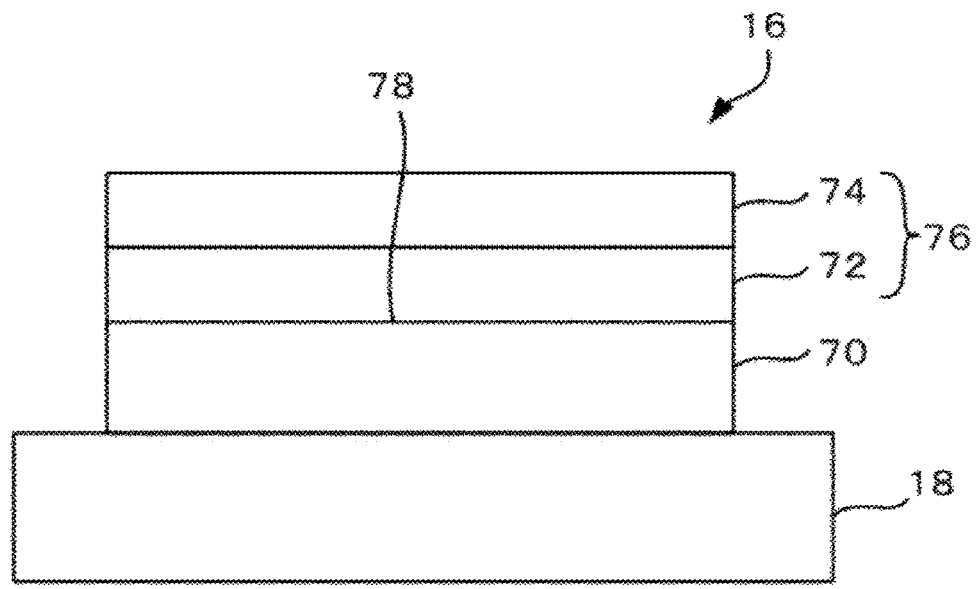
FIG. 15A is a view illustrating a process of a cutting method of a processing object and a manufacturing method of a semiconductor device, according to a third embodiment disclosed here.

As illustrated in FIG. 15A, the processing object 16 is placed on the stage 18. The processing object 16 serving as the object of cutting is not limited. Here, the processing object 16 is a substrate 70 (i.e., the substrate) provided with a laminated film 76 formed on the substrate 70. Material of the substrate 70 is SiC, for example. Material of the laminated film 76 is gallium nitride (GaN)-based material, for example. The laminated film 76 is for forming a Light Emitting Diode (LED) element, for example. For example, the laminated film 76 is a laminated film including a GaN layer 72 of the n type and a GaN layer 74 of the p type which are laminated or layered on each other. The laminated film 76 formed on the substrate 70 is removed at the interface 78 from the substrate 70 at a later process, and then is moved to another substrate 71 which will be described below. The GaN layer 72 of the n type and the GaN layer 74 of the p type can be formed by, for example, Metal Organic Chemical Vapor Deposition (MOCVD) method, a sputtering method, Atomic Layer Deposition (ALD) method, Molecular Beam Epitaxy (MBE) method, for example. The substrate 70 of the processing object 16 can be wafer or the substrate 70 may be obtained by cutting the wafer into a predetermined size in advance.

Figure 15B:
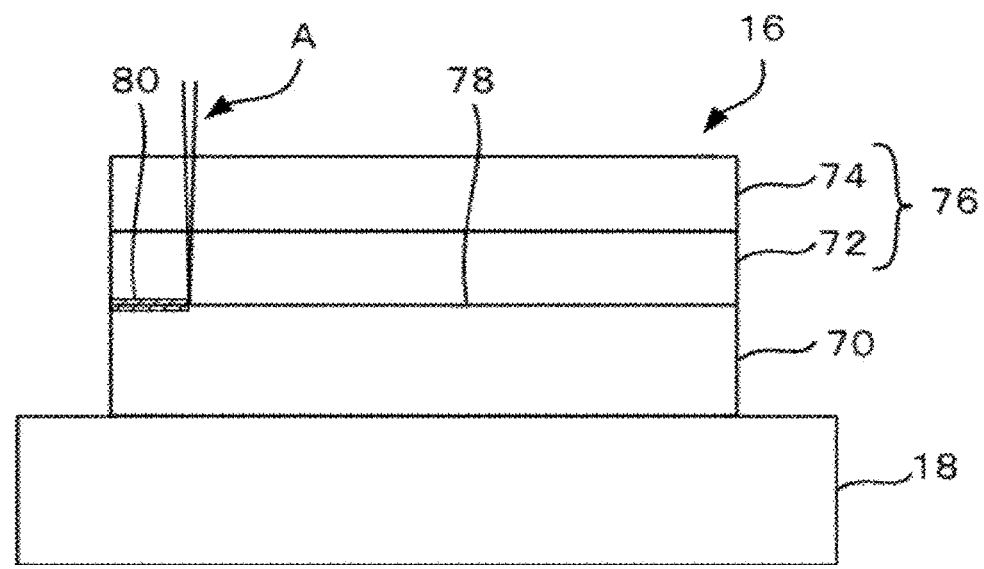
FIG. 15B is a view illustrating a process of the cutting method of the processing object and the manufacturing method of the semiconductor device, according to the third embodiment.

Next, as illustrated in FIG. 15B, the ultrashort-pulse laser light A is delivered or irradiated to the planned laser irradiation range. The planned laser irradiation range is, for example, the interface 78 between the substrate 70 and the film 76 or the vicinity of the interface 78. The light axis of the ultrashort-pulse laser light A is the direction intersecting the in-plane direction of the interface 78. More specifically, the direction of irradiation of the ultrashort-pulse laser light A is a normal direction of the interface 78. On the other hand, the scanning direction of the ultrashort-pulse laser light A is the in-plane direction of the interface 78. The scanning with the ultrashort-pulse laser light A is performed in a similar manner to the manner of the scanning with the ultrashort-pulse laser light A which is described in the first embodiment, and thus the description thereof will be omitted here. As described above, the material of the substrate 70 and the material of the film 76 are different from each other. Thus, when the ultrashort-pulse laser light A is delivered to, that is, irradiated at, the predetermined interface 78 pre-formed at the processing object 16 or the vicinity of the interface 78, the crack 53 (refer to FIG. 4B) can be grown or be generated along the interface 78 so as to follow the interface 78. In FIGS. 15B and 16A, a locus 80 indicates the locus of portions at which the ultrashort-pulse laser light A is focused, that is, the plane defined or formed by connecting the focus points 55 of the ultrashort-pulse laser light A.

A mechanism in which the crack 53 grows at the interface 78 is not sufficiently clear, however, the following mechanism can be considered, for example as the growth mechanism of the crack 53 at the interface 78.

That is, a multiphoton absorption coefficient of the ultrashort-pulse laser light A at the first portion 70 made from a first material and a multiphoton absorption coefficient of the ultrashort-pulse laser light A at the second portion 72 made from a second material which differs from the first material are different from each other. The decomposition occurs easily at the portion of which the multiphoton absorption coefficient is relative high, and the decomposition does not occur easily at the portion of which the multiphoton absorption coefficient is relative low. Thus, in a case where the multiphoton decomposition reaction occurs at the portion of which the multiphoton absorption coefficient is relatively high and the multiphoton decomposition reaction does not occur at the portion of which the multiphoton absorption coefficient is relatively low, the portion where the decomposition has occurred is present in the vicinity of the interface of the portion of which the multiphoton absorption coefficient is relatively high. A crystal condition of the portion where the decomposition has occurred is different from a crystal condition of a portion where the decomposition has not occurred. Because the surface defined by connecting the focus points 55 of the ultrashort-pulse laser light A is formed along the interface 78, the decomposition layer is formed along the interface 78. At the portion where the decomposition has occurred, not only the decomposition layer is formed but also the cavities or air gaps are generated. It is considered that such gaps, that is, air gaps, are connected to each other and accordingly the crack 53 is formed. The interface 78 serves as the guide to define or specify the direction in which the crack 53 grows, and as a result the crack 53 grows along the interface 78 so as to follow the interface 78. In addition, it is considered that the crystal being disconnected to each other between the material of a first side of the interface 78 and the material of a second side of the interface 78 also contributes to the growth of the crack 53 along the interface 50.

In addition, the following mechanism can also be considered as the mechanism in which the crack 53 grows at the interface 78.

When the ultrashort-pulse laser light A is delivered or irradiated, the ultrashort-pulse laser light A is reflected off the interface 78 and part of the ultrashort-pulse laser light A returns in the direction opposite to the direction of irradiation of the laser light A. At the interface 78 or in the vicinity of the interface 78, the intensity of the laser light A increases by the amount of the ultrashort-pulse laser light A which is reflected and returns. At a portion where the intensity of the laser light A increases, the intensity of the laser light A exceeds a threshold value of the decomposition of the material of the processing object 16, and therefore the decomposition of the processing object 16 occurs at the portion where the intensity of the ultrashort-pulse laser light A increases. Because the ultrashort-pulse laser light A is reflected at the interface 78, the decomposition takes place in the vicinity of the interface 78. The crystal condition of the portion where the decomposition has occurred is different from the crystal condition of the portion where the decomposition has not occurred. Because the surface defined by connecting the focus points 55 of the ultrashort-pulse laser light A is formed along the interface 78, the decomposition layer is formed along the interface 78. At the portion where the decomposition has occurred, not only the decomposition layer is formed but also the cavities or the air gaps are generated. It is considered that the crack 53 is formed in a case where the air gaps are connected to each other. The interface 78 serves as the guide to define or specify the direction in which the crack grows, and consequently the crack grows along the interface 78 so as to follow the interface 78.

In addition, it is also considered that the crack is grown by the synergistic effect of the difference in the multiphoton absorption coefficients at the interface 78 and the reflection of the ultrashort-pulse laser light A at the interface 78.

The cutting method of the processing object according to the present embodiment is not a method or technique of allowing a layer which includes a narrow band gap to absorb the laser light A linearly (a linear absorption) and melting the layer which includes the narrow band bap. A wavelength of the ultrashort-pulse laser light A applied in the present embodiment is a wavelength of energy that is smaller than a band gap of each portion of the processing object 16.

FIG. 16A is a cross-sectional view illustrating a state where the irradiation with the ultrashort-pulse laser light A is completed relative to the entire planned laser irradiation portion. The plane (the scanning locus, the locus surface) defined by connecting the focus points 55 to each other is formed along the interface 78 and the reformed layer is formed along the interface 78. In addition, at the interface 78 or in the vicinity of the interface 78, the crack 53 (refer to FIG. 4B) is formed along the interface 78 so as to follow the interface 78.

As described above in the first embodiment, at the stage where the crack 53 is formed, the processing object 16 is not always reliably separated at the crack 53. In a case where the processing object 16 is not surely separated at the crack 53, the processing object 16 can be separated, for example, in a manner similar to the first embodiment. The jig 56 can be appropriately modified to fit or match the processing object 16 of the present embodiment.

FIG. 16B is a cross-sectional view illustrating a state where the processing object 16 is separated at the crack 53. Here, the aforementioned another substrate 71 is joined to the laminated film 76, and thus the laminated film 76 is moved to a side of the aforementioned another substrate 71. The substrate 71 is a conductive substrate. The aforementioned another substrate 71 may function as a positive electrode of the LED element, for example.

Next, a surface of the laminated film 76 is ground or polished as needed. Next, as illustrated in FIG. 16C, a conductive film 82 is formed on the laminated film 76. The conductive film 82 may function as a negative electrode of the LED element, for example. In a case where the processing object 16 is already cut into individual pieces or divided pieces at this phase, the processing object 16 does not need to be further cut into pieces. However, in a case where the processing object 16 has not been cut into individual pieces or divided pieces, the processing object 16 is cut into an individual piece including a predetermined size. The LED element, for example, is manufactured as described above. In a case where the conductive film 82 is a transparent film, the conductive film 82 may be formed at an entire surface of the laminated film 76. In a case where the conductive film 82 is not transparent, it is ideal that the conductive film 82 is formed only partly so that emitted light is sufficiently and appropriately taken out. Here, the description is made on a case where the LED element is manufactured, however, an object of the manufacturing is not limited to the LED element. The present embodiment is applicable to the manufacturing of various semiconductor devices (electronic devices).

Figure 17:
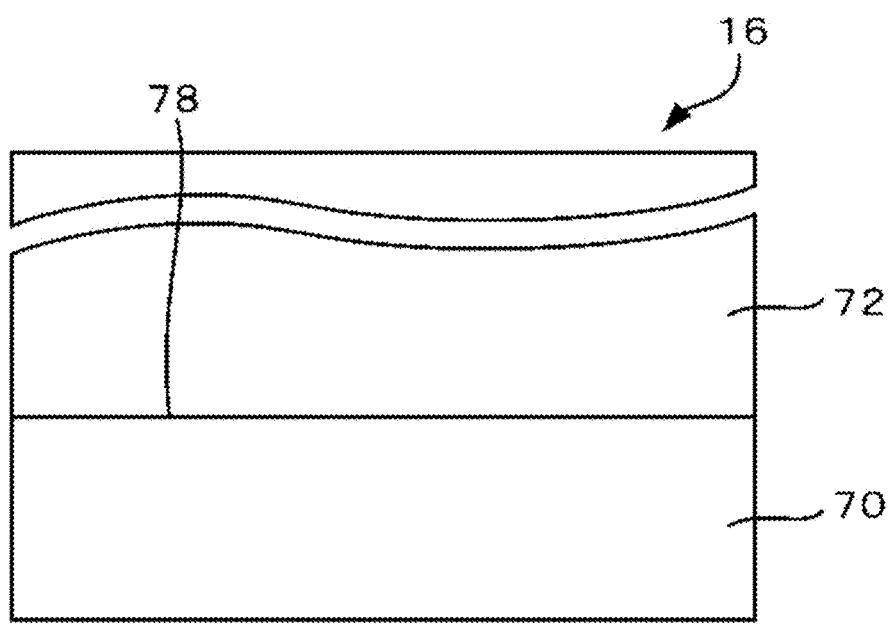
FIG. 17 is a view illustrating a variation of the processing object according to the third embodiment.

Variations of the processing object according to the present embodiment will be described with reference to FIG. 17. FIG. 17 is a view illustrating the variation of the processing object according to the present embodiment.

For example, the interface 78 of the processing object 16 may be the interface between the first portion 70 formed from SiC and the second portion 72 formed from AlN. Such a configuration occurs in a case where a GaN-based LED element layer formed on the SiC substrate 70 is separated from the SiC substrate 70.

In addition, the interface 78 of the processing object 16 may be the interface between the first portion 70 formed from GaN and the second portion 72 formed from AlGaN. Such a configuration occurs in a case where the GaN-based LED element layer formed on the GaN substrate 70 is separated from the GaN substrate 70.

In addition, the interface 78 of the processing object 16 can be the interface between the first portion 70 formed from $Ga_2O_3$ and the second portion 72 formed from GaN. Such a configuration occurs in a case where the GaN-based LED element layer formed on the $Ga_2O_3$ substrate 70 is separated from the $Ga_2O_3$ substrate 70. As an initial growth layer, for example, AlN, AlGaN, InGaN, InAlGaN, InAlN may be grown on the $Ga_2O_3$ substrate 70. In such cases, the interface 78 of the processing object 16 corresponds to the interface between the first portion 70 formed from $Ga_2O_3$ and the second portion 72 formed from, for example, AlN, AlGaN, InGaN, InAlGaN, InAlN.

In addition, the interface 78 of the processing object 16 may be the interface between the first portion 70 formed from sapphire and the second portion 72 formed from GaN.

Such a configuration occurs in a case where the GaN-based LED element layer formed on the sapphire substrate 70 is separated from the sapphire substrate 70. As the initial growth layer, for example, AlN, AlGaN, InGaN, InAlGaN, InAlN may be grown on the sapphire substrate 70. In such cases, the interface 78 of the processing object 16 corresponds to the interface between the first portion 70 formed from sapphire and the second portion 72 formed from, for example, AlN, AlGaN, InGaN, InAlGaN, InAlN.

In addition, the interface 78 of the processing object 16 may be the interface between the first portion 70 formed from SiC and the second portion 72 formed from carbon (C). Such a configuration occurs in a case where the C layer 72 formed on the SiC substrate 70 is separated from the SiC substrate 70.

In addition, the interface 78 of the processing object 16 may be the interface between the first portion 70 formed from Si and the second portion 72 formed from GaN. Such a configuration occurs in a case where the GaN layer 72 formed on the Si substrate 70 is separated from the Si substrate 70. As the initial growth layer, for example, AlN, AlGaN, InGaN, InAlGaN, InAlN may be grown on the Si substrate 70. In such cases, the interface 78 of the processing object 16 corresponds to the interface between the first portion 70 formed from Si and the second portion 72 formed from, for example, AlN, AlGaN, InGaN, InAlGaN, InAlN.

In addition, the interface 78 of the processing object 16 may be the interface between the first portion 70 formed from glass and the second portion 72 formed from GaN. Such a configuration occurs in a case where the GaN layer 72 formed on the glass substrate 70 is separated from the glass substrate 70. As the initial growth layer, for example, AlN, AlGaN, InGaN, InAlGaN, InAlN may be grown on the glass substrate 70. In such cases, the interface 78 of the processing object 16 corresponds to the interface between the first portion 70 formed from glass and the second portion 72 formed from, for example, AlN, AlGaN, InGaN, InAlGaN, InAlN.

In addition, the interface 78 of the processing object 16 can be the interface between the first portion 70 formed from glass and the second portion 72 formed from SiC. Such a configuration occurs in a case where the SiC layer 72 formed on the glass substrate 70 is separated from the glass substrate 70.

In addition, the interface 78 of the processing object 16 can be the interface between the first portion 70 formed from glass and the second portion 72 formed from C. Such a configuration occurs in a case where the C layer 72 formed on the glass substrate 70 is separated from the glass substrate 70.

In addition, the interface 78 of the processing object 16 can be the interface between the first portion 70 formed from C and the second portion 72 formed from C. More specifically, the interface 78 of the processing object 16 maybe the interface between the diamond substrate 70 and the graphite layer 72.

These layers can be appropriately formed by, for example, the MOCVD method, the sputtering method, the ALD method, the MBE method.

As described above, the cutting may be performed at the interface 78 between the portions 70 and 72 which are made of the different materials from each other. Also in the present embodiment, the predetermined interface 78 is formed at the processing object 16 in advance and the ultrashort-pulse laser light A is delivered or irradiated in a manner that the focus point 55 is positioned at the interface 78 or in the vicinity of the interface 78. Thus, also in the present embodiment, the processing object can be cut at the crack 53 grown with the high precision along the interface 78. Accordingly, also the present embodiment provides the cutting method of the processing object in which the processing object can be cut at the desired portion quickly and precisely, and the manufacturing method of, for example, the substrate where the cutting method is used.

Modified embodiments will be described. The embodiments are not limited to the aforementioned embodiment and various modifications can be made thereto.

For example, in a process of delivering or irradiating the ultrashort-pulse laser light A, heat (a heat treatment) can be applied to the processing object 16. In a case where the processing object 16 is heated during the irradiation with the ultrashort-pulse laser light A, the crack 53 is formed even more efficiency.

In addition, after the process of delivering the ultrashort-pulse laser light A before the separating process of separating the processing object 16, the heat (the heat treatment) can be applied to the processing object 16. In a case where the processing object 16 is heated after the irradiation with the ultrashort-pulse laser light A, the crack 53 that has been generated by the irradiation with the ultrashort-pulse laser light A is grown further.

In addition, in the process of separating the processing object 16, the heat (the heat treatment) can be applied to the processing object 16.

In addition, in the process of separating the processing object 16, the processing object 16 can be immersed in medicinal solution. For example, the medicinal solution includes medicinal solution which can selectively etch and remove the reformed layer (the decomposition layer). By immersing the processing object 16 formed with the crack 53 by the irradiation with the ultrashort-pulse laser light A in such a medicinal solution, the processing object 16 can be separated at the crack 53.

In addition, in the process of separating the processing object 16, a UV ozone treatment can be conducted relative to the processing object 16. By applying the UV ozone treatment to the processing object 16 formed with the crack 53 by the irradiation with the ultrashort-pulse laser light A, the processing object 16 can be separated at the crack 53.

In the above-described embodiments, the description is made on a case where the scanning with the ultrashort-pulse laser light A is performed by moving the stage 18, however, the scanning is not limited thereto. For example, the processing object 16 can be scanned with the ultrashort-pulse laser light A with the use of a galvanometer mirror and an F-Theta (Fθ) lens. In addition, the ultrashort-pulse laser light A can be formed linearly with the use of a cylindrical lens and the linearly-formed ultrashort-pulse laser light A can be delivered to the processing object 16. In addition, the laser beam can be branched into plural beams or rays with the use of Diffractive Optical Element (DOE), and the branched plural laser beams can be delivered to or irradiated at the processing object 16 at the same time. In addition, the ultrashort-pulse laser light A of which a diameter of an irradiation spot is relatively large can be delivered without performing the scanning.

In the above-described embodiments, the description is made on a case where the scanning with the ultrashort-pulse laser light A is performed linearly, however, the scanning with the ultrashort-pulse laser light A is not limited to the linear configuration. For example, the scanning of the ultrashort-pulse laser light A can be performed in a circular configuration. Alternatively, the scanning of the ultrashort-pulse laser light A can be performed spirally (in a form of a coil). That is, the scanning can be conducted in a manner that the ultrashort-pulse laser light A draws a circular scanning locus or a coiled scanning locus on the stage. In these cases, the rotation stage may be used as the stage 18.

Further, the following additional remarks are disclosed with regards to the aforementioned embodiments.

(Additional remark 1) The manufacturing method of the substrate, the method includes the crack forming process of forming the crack along the interface between the first portion of the processing object and the second portion of the processing object, the crack-forming process forming the crack in a manner that the ultrashort-pulse laser light is irradiated so that the focus point of the ultrashort-pulse laser light is positioned at the interface or in the vicinity of the interface, and the separating process of separating the processing object at the crack, wherein the impurity concentration of the first portion and the impurity concentration of the second portion are different from each other or the material of the first portion and the material of the second portion are different from each other.

According to the aforementioned configuration, the ultrashort-pulse laser light A is irradiated so that the focus point 55 of the ultrashort-pulse laser light A is positioned at the interface 50, 62*a*, 62*b*, 62*c*, 62*d*, 62*e*, 62*f*, 62*g*, 62*h*, 78 between the first portion 46, 58*a*, 58*b*, 58*c*, 58*d*, 58*e*, 70 of the processing object 16 and the second portion 48, 60*a*, 60*b*, 60*c*, 60*d*, 72 of the processing object 16 or in the vicinity of the interface 50, 62*a*, 62*b*, 62*c*, 62*d*, 62*e*, 62*f*, 62*g*, 62*h*, 78. The impurity concentration of the first portion 46, 58*a*, 58*b*, 58*c*, 58*d*, 58*e*, 70 and the impurity concentration of the second portion 48, 60*a*, 60*b*, 60*c*, 60*d*, 72 are different from each other, or the material of the first portion 46, 58*a*, 58*b*, 58*c*, 58*d*, 58*e*, 70 and the material of the second portion 48, 60*a*, 60*b*, 60*c*, 60*d*, 72 are different from each other. Consequently, the crack 53 is generated precisely along the interface 50, 62*a*, 62*b*, 62*c*, 62*d*, 62*e*, 62*f*, 62*g*, 62*h*, 78. In addition, the processing object is cut easily at the crack 53. According to the aforementioned embodiments, for example, the cutting method of the processing object 16, in which the processing object 16 can be cut at the desired position promptly with the high precision by forming the crack 53, is provided.

(Additional remark 2) The manufacturing method of the substrate described in the additional remark 1, wherein the ultrashort-pulse laser light entering the processing object includes the light axis corresponding to the direction intersecting the in-plane direction of the interface and the locus of the portion at which the ultrashort-pulse laser light is focused is along the interface.

(Additional remark 3) The manufacturing method of the substrate described in either the additional remarks 1 or 2, wherein the irradiation of the ultrashort-pulse laser light is repeated in the crack forming process.

(Additional remark 4) The manufacturing method of the substrate described in any one of the additional remarks 1 to 3, wherein the processing object includes the plural interfaces formed to be apart from each other in the normal direction of the interfaces, and the ultrashort-pulse laser light is irradiated to each of the plural interfaces and the crack is formed along each of the plural interfaces in the crack forming process.

(Additional remark 5) The manufacturing method of the substrate described in any one of the additional remarks 1 to 4, wherein the cross section of the ultrashort-pulse laser light at the interface corresponds to the oval shape and the scanning direction of the ultrashort-pulse laser light intersects the long axis of the oval shape.

(Additional remark 6) The manufacturing method of the substrate described in any one of the additional remarks 1 to 5, wherein the focus point of the ultrashort-pulse laser light is positioned to be displaced from the interface in the normal direction of the interface in the crack forming process.

(Additional remark 7) According to the manufacturing method of the substrate described in any one of the additional remarks 1 to 6, wherein heat is applied to the processing object in the crack forming process.

(Additional remark 8) The manufacturing method of the substrate described in any one of the additional remarks 1 to 7 further includes a heating process of heating the processing object after the crack forming process before the separating process.

(Additional remark 9) According to the manufacturing method of the substrate described in any one of the additional remarks 1 to 8, wherein heat is applied to the processing object in the separating process.

(Additional remark 10) According to the manufacturing method of the substrate described in any one of the additional remarks 1 to 8, wherein the processing object is immersed in medicinal solution in the separating process.

(Additional remark 11) According to the manufacturing method of the substrate described in any one of the additional remarks 1 to 8, wherein a UV ozone treatment is conducted relative to the processing object in the separating process.

(Additional remark 12) The manufacturing method of the substrate described in any one of the additional remarks 1 to 8, wherein the processing object is separated in the separating process in a manner that the external force in the direction along the in-plane direction of the interface is applied to the processing object.

(Additional remark 13) The cutting method of the processing object includes the crack forming process of forming the crack along the interface between the first portion of the processing object and the second portion of the processing object, the crack-forming process forming the crack in a manner that the ultrashort-pulse laser light is irradiated so that the focus point of the ultrashort-pulse laser light is positioned at the interface or in the vicinity of the interface, and the separating process of separating the processing object at the crack, wherein the impurity concentration of the first portion and the impurity concentration of the second portion are different from each other or the material of the first portion and the material of the second portion are different from each other.

(Additional remark 14) The laser processing apparatus includes the light source (i.e., the laser light source) emitting the ultrashort-pulse laser light, and the control portion forming the crack along the interface between the first portion of the processing object and the second portion of the processing object, the control portion forming the crack in a manner that the ultrashort-pulse laser light is irradiated so that the focus point of the ultrashort-pulse laser light is positioned at the interface or in the vicinity of the interface, wherein the impurity concentration of the first portion and the impurity concentration of the second portion are different from each other or the material of the first portion and the material of the second portion are different from each other.

The principles, preferred embodiments and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A manufacturing method of a substrate, the method comprising:
    a crack forming process of forming a crack along an interface between a first portion of a processing object and a second portion of the processing object, the crack-forming process forming the crack in a manner that an ultrashort-pulse laser light is irradiated so that a focus point of the ultrashort-pulse laser light is positioned at the interface or in a vicinity of the interface; and
    a separating process of separating the processing object at the crack, wherein
    an impurity concentration of the first portion and an impurity concentration of the second portion are different from each other or material of the first portion and material of the second portion are different from each other.

2. The manufacturing method of the substrate according to claim 1, wherein
    the ultrashort-pulse laser light entering the processing object includes a light axis corresponding to a direction intersecting an in-plane direction of the interface and
    a locus of a portion at which the ultrashort-pulse laser light is focused is along the interface.

3. The manufacturing method of the substrate according to claim 1, wherein the irradiation of the ultrashort-pulse laser light is repeated in the crack forming process.

4. The manufacturing method of the substrate according to claim 1, wherein
    the processing object includes a plurality of interfaces formed to be apart from each other in a normal direction of the interfaces and
    the ultrashort-pulse laser light is irradiated to each of the plurality of interfaces and the crack is formed along each of the plurality of interfaces in the crack forming process.

5. The manufacturing method of the substrate according to claim 1, wherein
    a cross section of the ultrashort-pulse laser light at the interface corresponds to an oval shape and
    a scanning direction of the ultrashort-pulse laser light intersects a long axis of the oval shape.

6. The manufacturing method of the substrate according to claim 1, wherein the focus point of the ultrashort-pulse laser light is positioned to be displaced from the interface in a normal direction of the interface in the crack forming process.

7. The manufacturing method of the substrate according to claim 1, wherein the processing object is separated in the separating process in a manner that an external force in a direction along an in-plane direction of the interface is applied to the processing object.

8. A cutting method of a processing object comprising:
    a crack forming process of forming a crack along an interface between a first portion of the processing object and a second portion of the processing object, the crack-forming process forming the crack in a manner that an ultrashort-pulse laser light is irradiated so that a focus point of the ultrashort-pulse laser light is positioned at the interface or in a vicinity of the interface; and
    a separating process of separating the processing object at the crack, wherein
    an impurity concentration of the first portion and an impurity concentration of the second portion are different from each other or material of the first portion and material of the second portion are different from each other.

9. A laser processing apparatus comprising:
    a light source emitting an ultrashort-pulse laser light; and
    a control portion forming a crack along an interface between a first portion of a processing object and a second portion of the processing object, the control portion forming the crack in a manner that an ultrashort-pulse laser light is irradiated so that a focus point of the ultrashort-pulse laser light is positioned at the interface or in a vicinity of the interface, wherein
    an impurity concentration of the first portion and an impurity concentration of the second portion are different from each other or material of the first portion and material of the second portion are different from each other.

* * * * *